(12) United States Patent
Kitagawa et al.

(10) Patent No.: US 8,144,499 B2
(45) Date of Patent: Mar. 27, 2012

(54) VARIABLE RESISTANCE MEMORY DEVICE

(75) Inventors: Makoto Kitagawa, Kanagawa (JP);
Tsunenori Shiimoto, Kanagawa (JP);
Wataru Otsuka, Tokyo (JP)

(73) Assignee: Sony Corporation, Tokyo (JP)

( * ) Notice: Subject to any disclaimer, the term of this patent is extended or adjusted under 35 U.S.C. 154(b) by 1 day.

(21) Appl. No.: 12/654,484

(22) Filed: Dec. 22, 2009

(65) Prior Publication Data

US 2010/0182820 A1     Jul. 22, 2010

(30) Foreign Application Priority Data

Jan. 22, 2009   (JP) ................... 2009-012385

(51) Int. Cl.
*G11C 11/00*     (2006.01)
*G11C 7/00*     (2006.01)

(52) U.S. Cl. ................. 365/148; 365/189.011

(58) Field of Classification Search .......... None
See application file for complete search history.

(56) References Cited

U.S. PATENT DOCUMENTS

| | | | | |
|---|---|---|---|---|
| 6,995,999 | B2* | 2/2006 | Morimoto | 365/148 |
| 7,221,600 | B2* | 5/2007 | Hara et al. | 365/189.08 |
| 2006/0007729 | A1* | 1/2006 | Cho et al. | 365/163 |
| 2006/0067106 | A1* | 3/2006 | Mori et al. | 365/148 |
| 2008/0062739 | A1* | 3/2008 | Bill et al. | 365/148 |

FOREIGN PATENT DOCUMENTS

| | | |
|---|---|---|
| JP | 2000-076878 | 3/2000 |
| JP | 2002-319289 | 10/2002 |
| JP | 2005-063647 A | 3/2005 |
| JP | 2006-099882 A | 4/2006 |
| JP | 2006-155700 | 6/2006 |
| JP | 2006-294181 A | 10/2006 |
| JP | 2006-331626 A | 12/2006 |
| JP | 2007-250171 A | 9/2007 |
| JP | 2008-010035 | 1/2008 |

OTHER PUBLICATIONS

K. Aratani, et al., "A Novel Resistance Memory with High Scalability and Nanosecond Switching," Technical Digest IEDM 2007, pp. 783-786, Japan.
K. Tsunoda, et al., "Low Power and High Speed Switching of Ti-doped NiO ReRAM under the Unipolar Voltage Source of less than 3 V," IEEE 2007, pp. 767-770, Japan.
Japanese Office Action issued Nov. 9, 2010 for corresponding Japanese Application No. 2009-012385.

* cited by examiner

*Primary Examiner* — Hoai V Ho
*Assistant Examiner* — James G Norman
(74) *Attorney, Agent, or Firm* — Rader, Fishman & Grauer PLLC

(57) ABSTRACT

A variable resistance memory device includes: a first common line; a second common line; plural memory cells each formed by serially connecting a memory element, resistance of which changes according to applied voltage, and an access transistor between the second common line and the first common line; a common line pass transistor connected between the first common line and a supply node for predetermined voltage; and a driving circuit that controls voltage of the second common line, the predetermined voltage, and voltage of a control node of the common line pass transistor and drives the memory cells.

14 Claims, 32 Drawing Sheets

SET (WRITE) SCHEMA

BL POWER SUPPLY

VARIABLE RESISTANCE MEMORY DEVICE

BACKGROUND OF THE INVENTION

1. Field of the Invention

The present invention relates to a variable resistance memory device in which respective memory cells are formed by serially connecting memory elements, resistance of which changes according to applied voltage, and access transistors.

2. Description of the Related Art

There is known a variable resistance memory device having, for each of memory cells, a memory element, resistance of which changes according to injection of conductive ions into an insulating film or removal of conductive ions from the insulating film (see, for example, K. Aratani, etc. "A Novel Resistance Memory with High Scalability and Nanosecond Switching", Technical Digest IEDM 2007, pp. 783 to 786 (Non-Patent Document 1).

The memory element has a laminated structure in which a supply layer for the conductive ions and the insulating film are formed between two electrodes.

The memory cell is formed by serially connecting the memory element and an access transistor between first and second active-matrix drivable common lines. Such a memory cell is called 1T1R-type memory cell because the memory cell has one transistor (T) and one (variable) resistor (R).

The memory device having this 1T1R-type memory cell is called ReRAM.

The ReRAM is capable of performing write and erase operation with a pulse having short duration in nanosecond [ns] order with the level of resistance associated with write and erase of data. Therefore, the ReRAM attracts attention as a nonvolatile memory (NVM) capable of performing operation at speed as high as that of a random access memory (RAM).

However, there are several barriers that should be overcome in order to replace the existing FG (Floating Gate) NAND NVM (flash memory) with the ReRAM. One of the barriers is that write and erase characteristics of the memory cell have dependency on the number of times of rewriting.

Therefore, an optimum operation condition applied to the memory cell changes according to the number of times of rewriting. In other words, if a use condition such as frequency of rewriting is different, rewriting current and voltage stress necessary and sufficient for the memory cell is also different. Excessive rewriting current and voltage stress is undesirable because the rewriting current and voltage stress increases leak and varies (reduces) a rewritable number of times.

In other words, the nonvolatile memory device of this type can attain both the guarantee of an upper limit of the number of times of rewriting and the maintenance of a data storage characteristic on condition that rewriting current and voltage stress necessary and sufficient at every moment is given.

There is known a driving method for carrying out, for the purpose of performing the necessary and sufficient driving, verification readout operation (hereinafter referred to as verify operation) after pulse application with an initial current or an initial voltage, which are applied to the memory cell during one rewriting, set rather low. In this driving method, in general, a current value or a voltage value that should be applied next is determined according to a result of the verification readout (a verify result).

However, in this driving method, the verify operation needs to be performed every time write or erase is performed. This hinders the high-speed operation.

Various devices for improving high-speed properties in the driving method involving the verify operation are proposed (JP-A-2008-10035, JP-A-2000-76878, and JP-A-2002-319289 (Patent Documents 1 to 3) and K. Aratani, etc. "A Novel Resistance Memory with High Scalability and Nanosecond Switching", Technical Digest IEDM 2007, pp. 783 to 786 and K. Tsunoda, etc. "Low Power and High Speed Switching of Ti-doped NiO ReRAM under the Unipolar Voltage Source of less than 3V", 2007 IEEE, pp. 267 to 270 (Non-Patent Document 1 and 2)).

Patent Document 1 and Non-Patent Document 2 describe or indicate that voltage (or electric current) applied to a 1T1R-type memory cell is controlled by controlling a gate voltage of an access transistor and a drain voltage of the access transistor. In Patent Document 1 and Non-Patent Document 2, the control of the gate voltage and the drain voltage enables high-speed operation while guaranteeing write and erase characteristics even if the memory cell has dependency on the number of times of rewriting.

In a MONOS flash memory, there is also known a technique for controlling a gate voltage and a drain voltage of a transistor (see, for example, Patent Documents 2 and 3).

In a variable phase memory, there is also known a technique for controlling a drain voltage (a bit line voltage) (see, for example, JP-A-155700 (Patent Document 4)). In this technique, a configuration for providing plural bit line drivers and switching the bit line drivers is disclosed.

SUMMARY OF THE INVENTION

However, Patent Document 1 and Non-Patent Document 2 do not described specific operation, a specific method, and a specific control circuit.

When the gate voltage of the access transistor is controlled in Patent Document 1 and Non-Patent Document 2, for example, as described in the application to a NAND flash memory in Patent Document 2, it is possible to apply connection of a word line driver to each of word lines.

However, if one word line driver is connected to one word line that connects access transistors in common for each of cell rows, the configuration of an entire control circuit is complicated. It is necessary to increase a driver ability in order to drive a word line having a large load. A circuit size of the control circuit is large. Even if the driver ability is increased to some extent, standby time for deciding a potential change of the word line having a large load needs to be estimated large to some extent. This hinders high-speed operation.

When the drain voltage (a bit line voltage) of the access transistor is controlled in Patent Document 1 and Non-Patent Document 2, it is possible to adopt a configuration for switching plural bit line drivers (called write amplifier circuit) using two bit lines. This configuration is described, for example, in the application to a variable phase memory in Patent Document 4.

However, if the plural bit line drivers are switched to set different voltages for one bit line, an error occurs in the set voltages because of characteristic fluctuation and the like of a transistor.

In particular, in the ReRAM, since resistance gradually changes according to applied voltage, the level of resistance obtained with respect to fluctuation in the set voltages of the bit line sensitively fluctuates. Therefore, the adoption of such a method of switching the plural bit line drivers to set different voltages is not very preferable in the ReRAM.

In this method, stabilization of a bit line voltage takes time because the driver itself is switched. It is anticipated that the method is disadvantageous for an increase in speed as well.

Moreover, when the plural bit lines are simultaneously controlled to read out stored data in word units or page units, a circuit size increases in the control circuit described in Patent Document 4.

Therefore, it is desirable to provide a variable resistance memory device that can execute operation for enabling high-speed operation while suppressing the size of a driving circuit.

A variable resistance memory device according to an embodiment of the present invention includes: a first common line; a second common line; and plural memory cells each formed by serially connecting a memory element, resistance of which changes according to applied voltage, and an access transistor between the second common line and the first common line. Further, the variable resistance memory device includes: a common line pass transistor connected between the first common line and a supply node for predetermined voltage; and a driving circuit that controls the voltage of the second common line, the predetermined voltage, and the voltage of a control node of the common line pass transistor and drives the memory cells.

With the configuration explained above, the resistance of the memory cells changes according to a direction of voltage applied to the first common line and the second common line. This voltage control is executed by the driving circuit. The common line pass transistor is connected between the first common line and the supply node for the predetermined voltage. The voltage of the control node of the common line pass transistor is controlled by the driving circuit.

In this configuration, even when the load of the first common line is large, the common line pass transistor drives the voltage or the current of the first common line via a control line of the common line pass transistor different from the first common line. Driving of voltage and current applied to the memory cells is sufficiently performed by the driving via the control line of the common line pass transistor.

According to the embodiment of the present invention, it is possible to provide a variable resistance memory device that can execute operation for enabling high-speed operation while suppressing the size of a driving circuit.

DESCRIPTION OF THE PREFERRED EMBODIMENTS

Embodiments of the present invention are explained below with reference to the accompanying drawings. The embodiments are explained in order described below.

Figure 5:
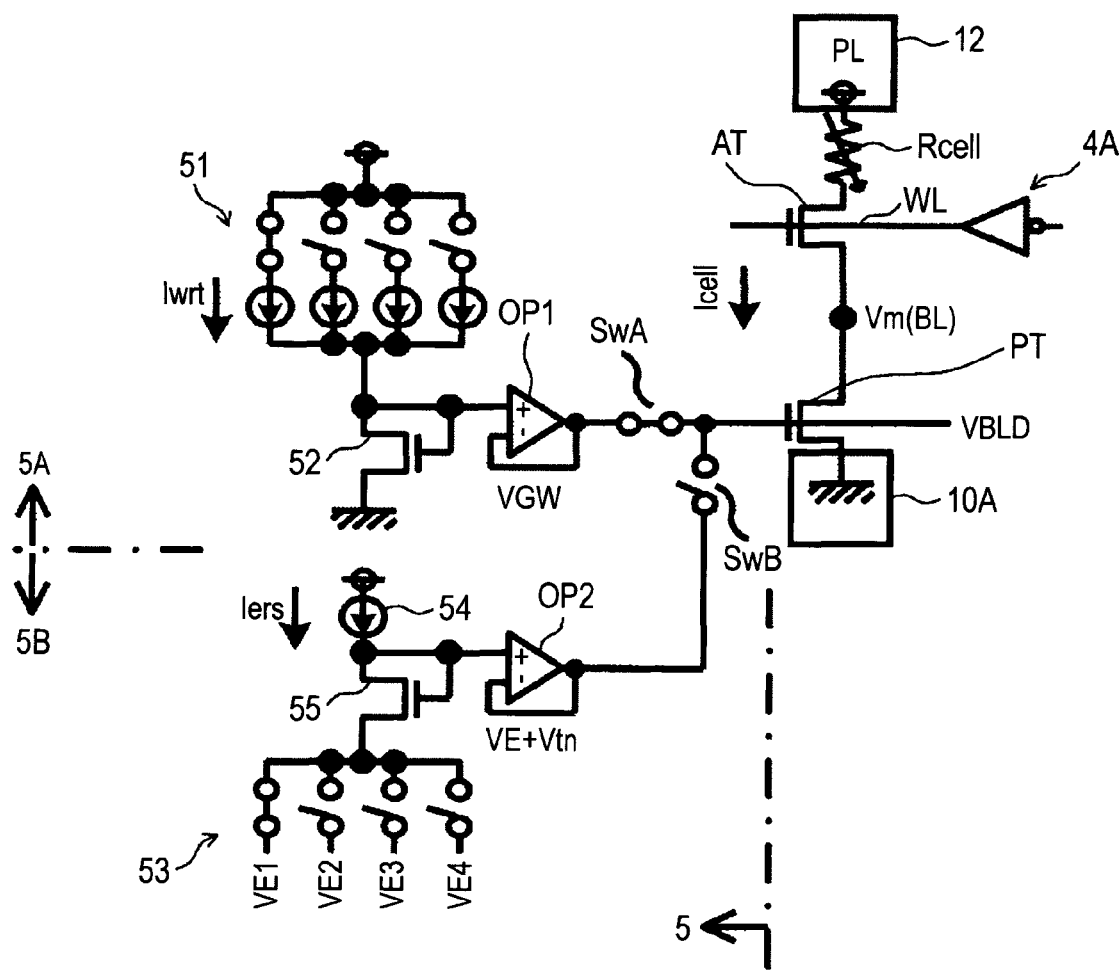
FIG. 5 is a diagram of memory cell connection during set of a driving circuit according to a first embodiment of the present invention.
Figure 6:
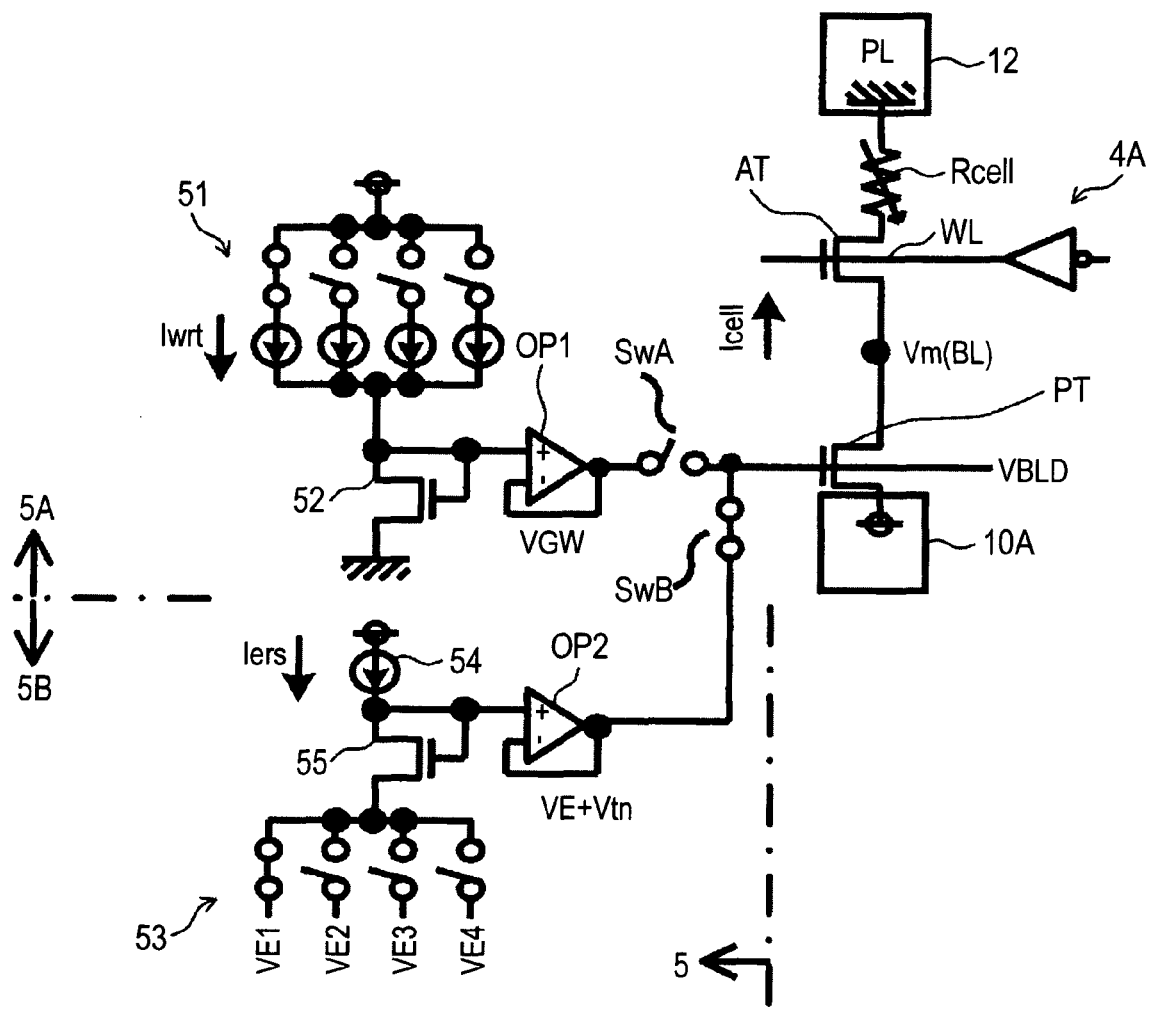
FIG. 6 is a diagram of memory cell connection during reset of the driving circuit according to the first embodiment.

1. First Embodiment: An N-type (common line pass transistor) PT is driven in a grounded state of a source (FIGS. 5 and 6)

Figure 7:
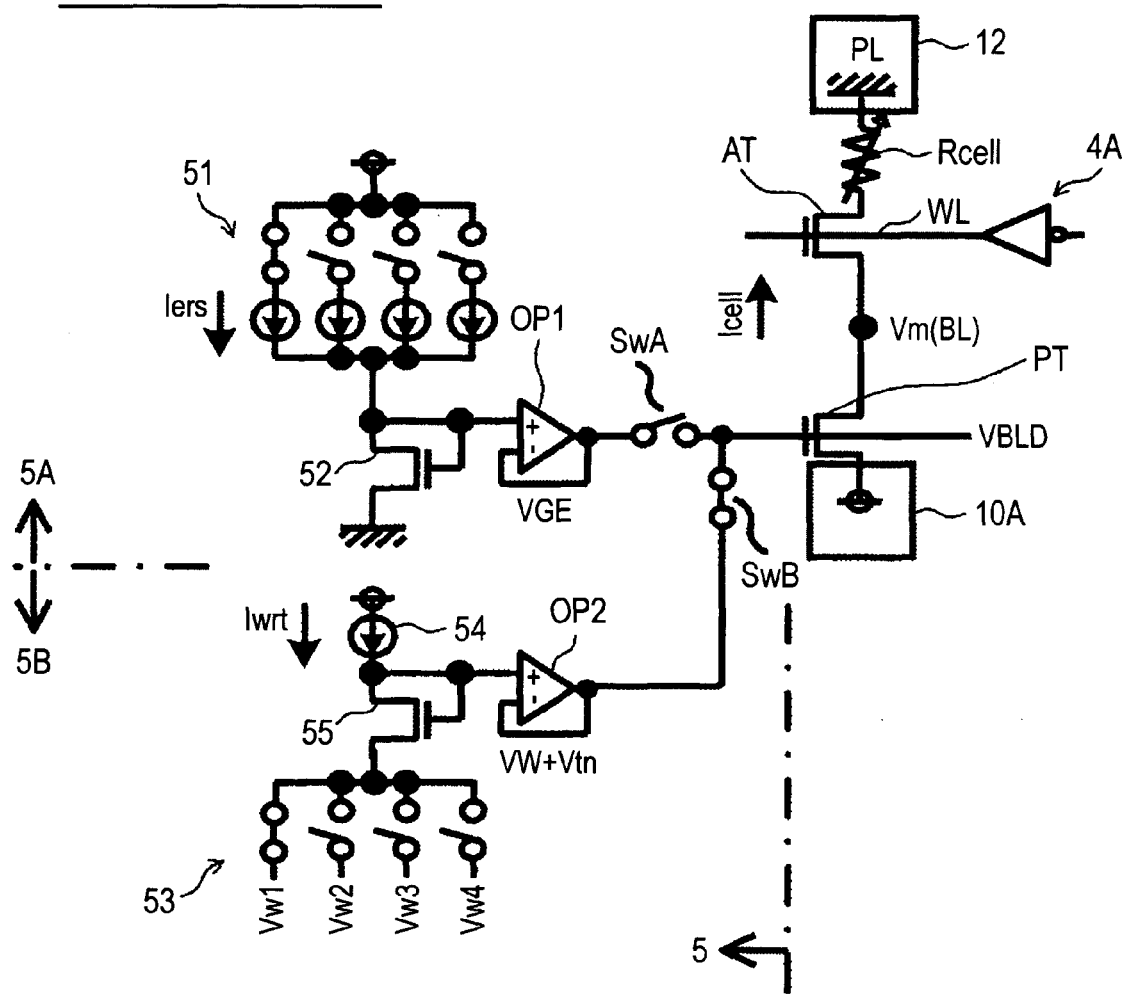
FIG. 7 is a diagram of memory cell connection during set of a driving circuit according to a second embodiment of the present invention.
Figure 8:
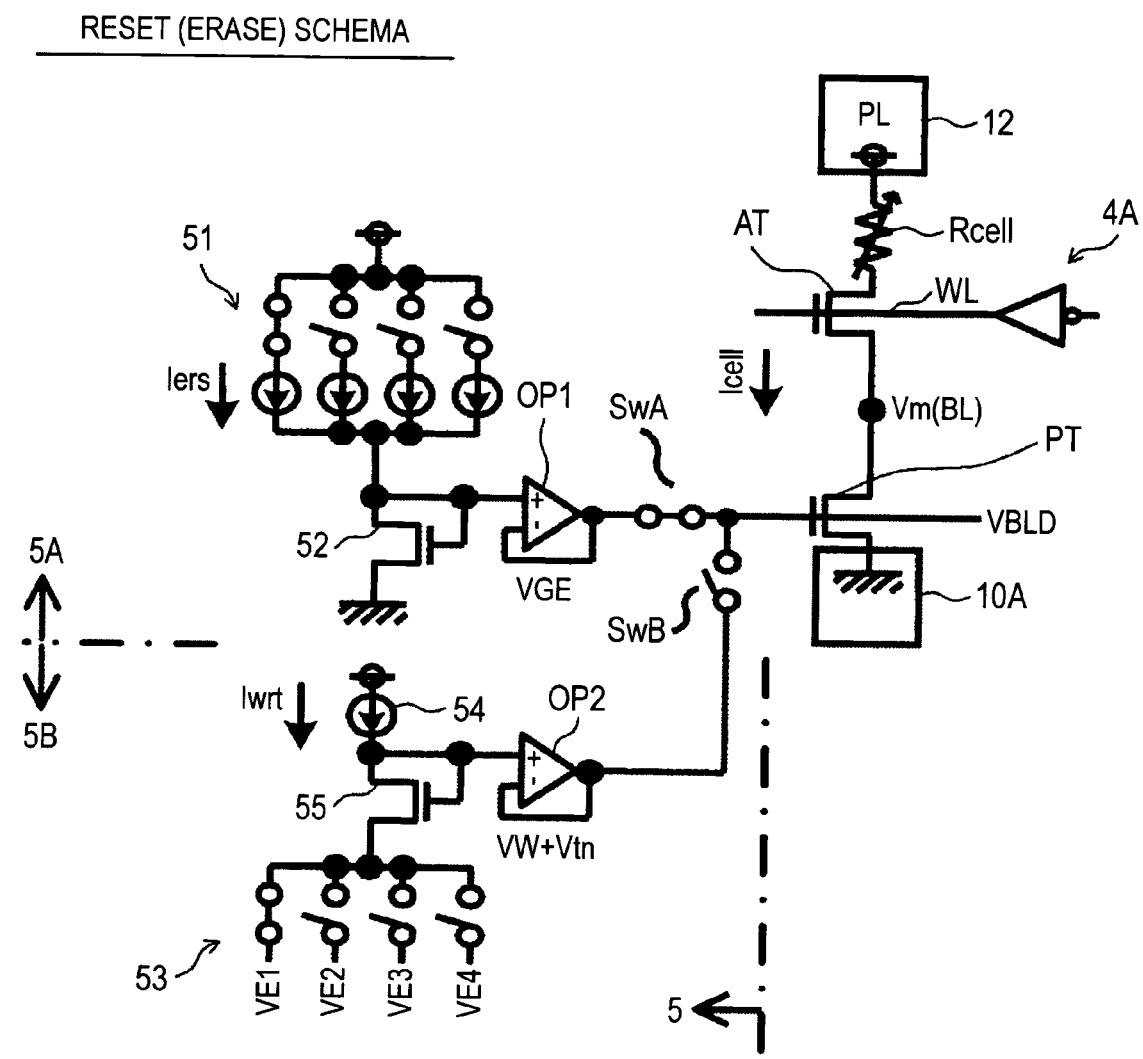
FIG. 8 is a diagram of memory cell connection during reset of the driving circuit according to the second embodiment.

2. Second Embodiment: An N-type PT is driven in a Vdd connected state of a drain (FIGS. 7 and 8)

Figure 9:
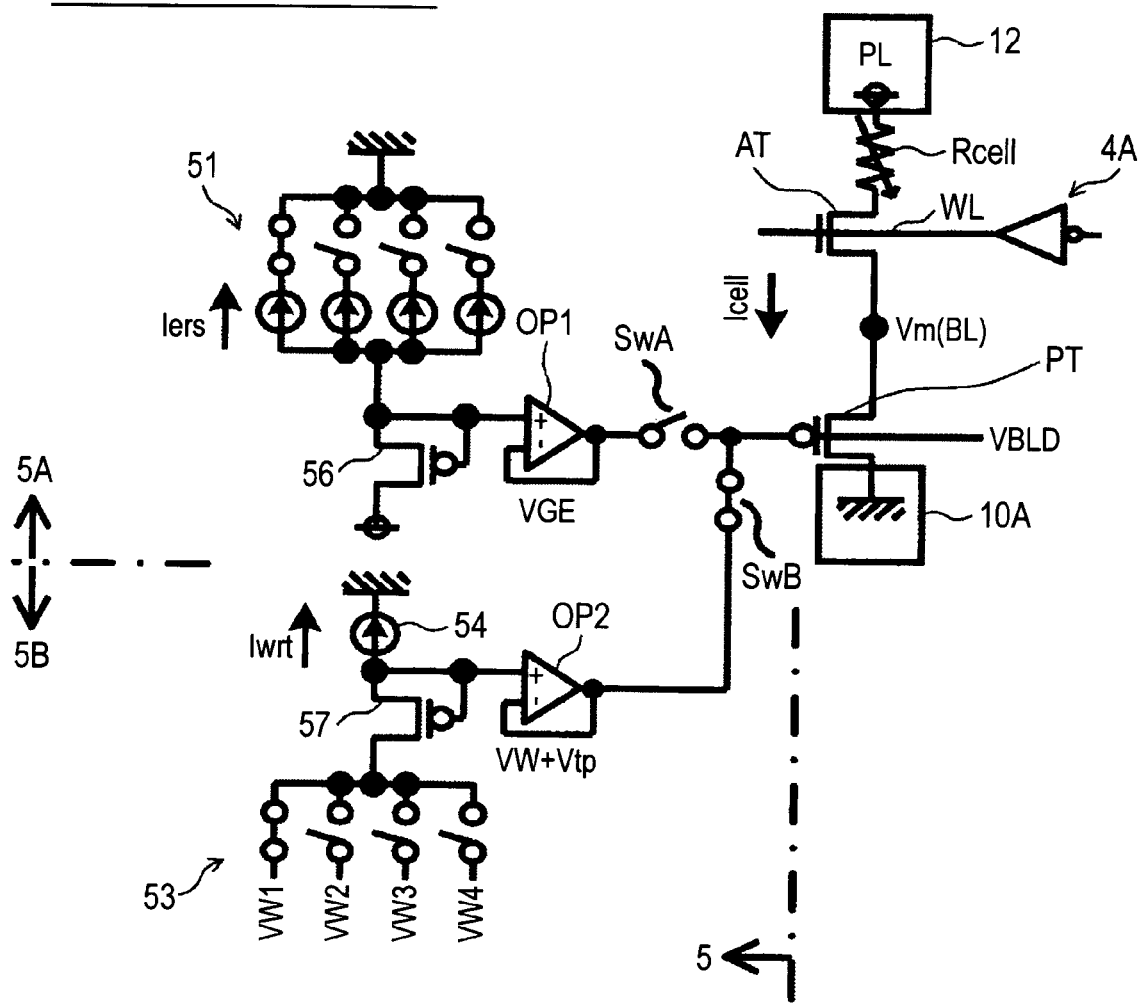
FIG. 9 is a diagram of memory cell connection during set of a driving circuit according to a third embodiment of the present invention.
Figure 10:
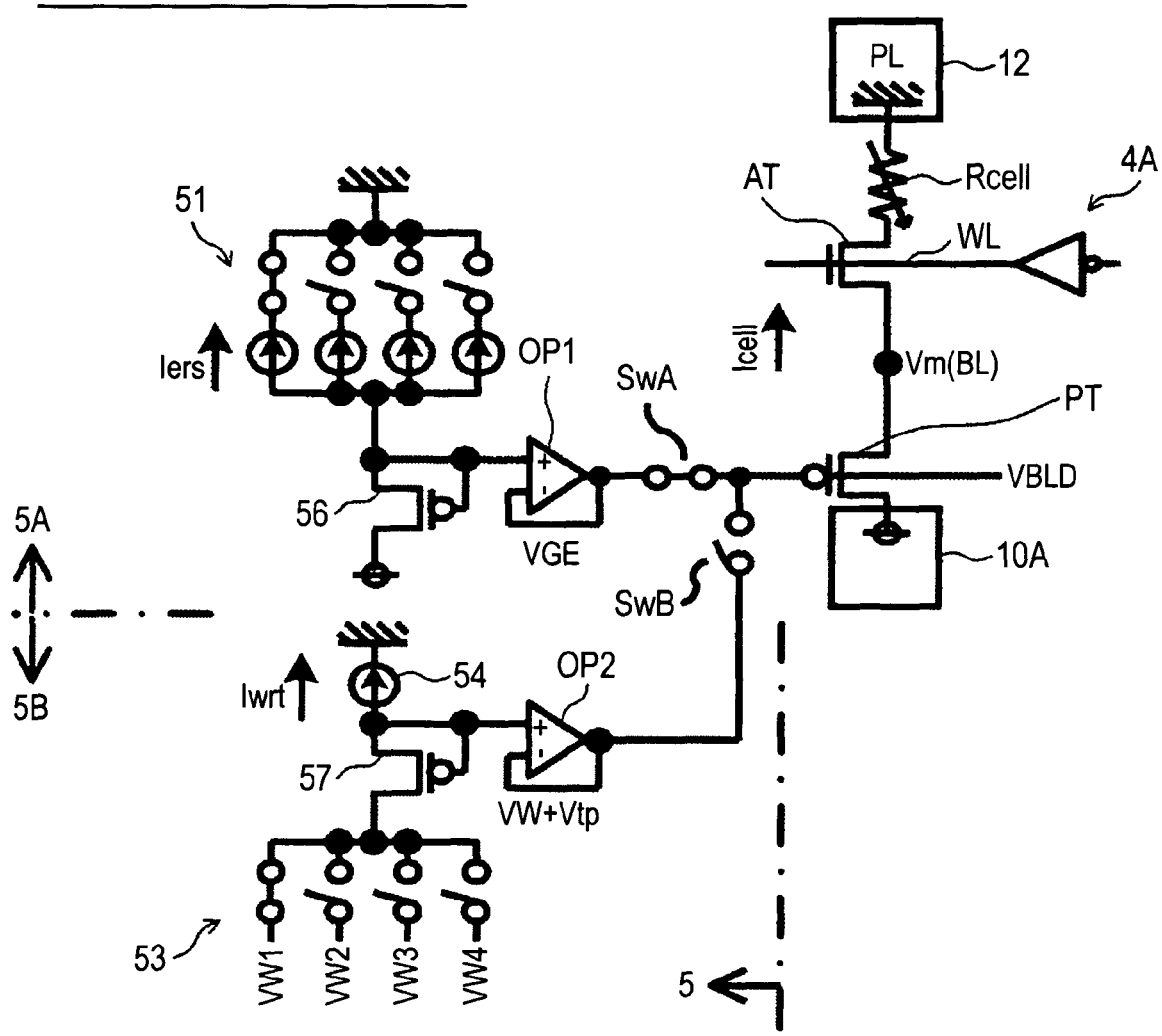
FIG. 10 is a diagram of memory cell connection during reset of the driving circuit according to the third embodiment.

3. Third Embodiment: A P-type PT is driven in a grounded state of a drain (FIGS. 9 and 10)

Figure 11:
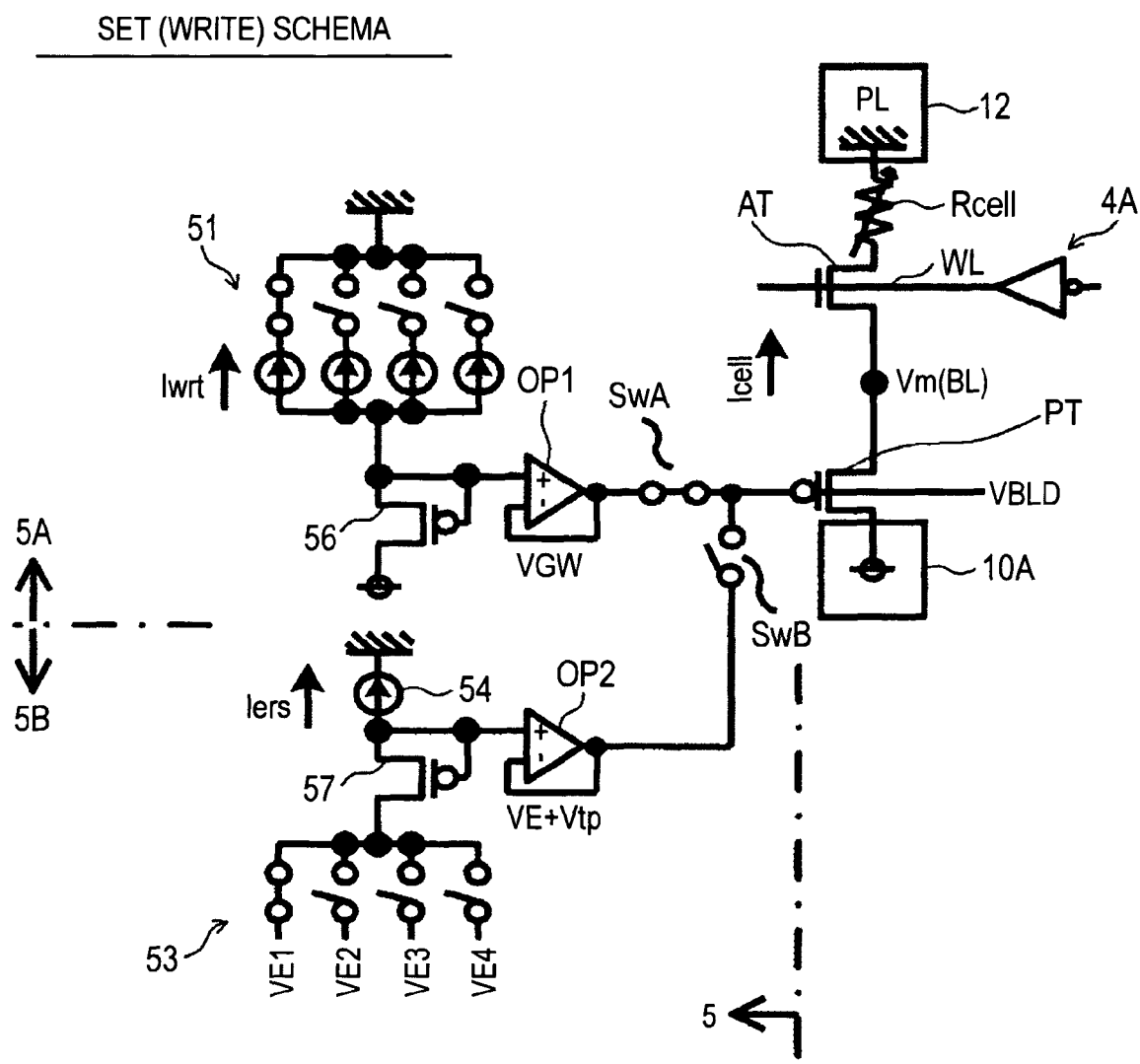
FIG. 11 is a diagram of memory cell connection during set of a driving circuit according to a fourth embodiment of the present invention.
Figure 12:
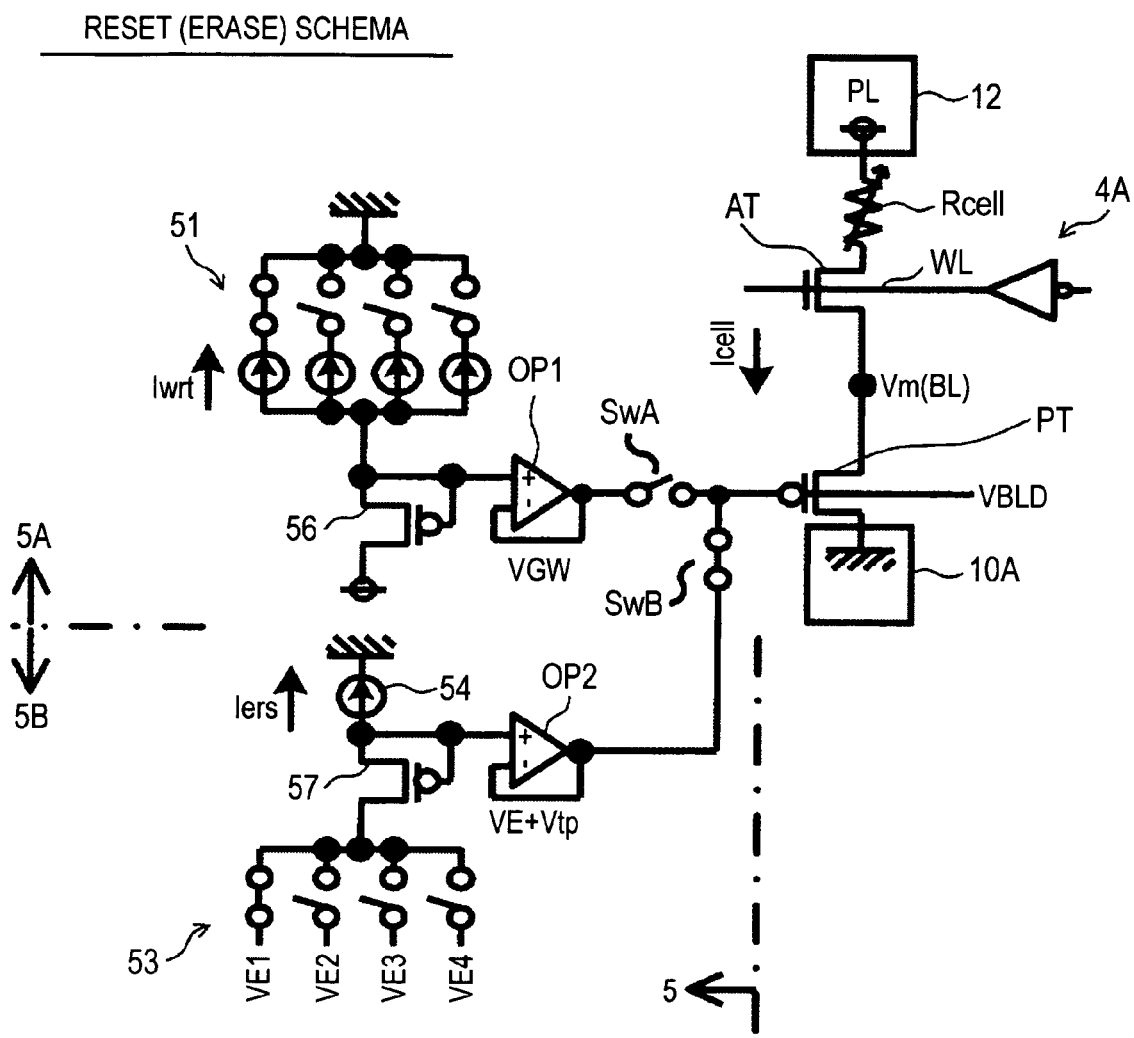
FIG. 12 is a diagram of memory cell connection during reset of the driving circuit according to the fourth embodiment.

4. Fourth Embodiment: A P-type PT is driven in a Vdd connected state of a source (FIGS. 11 and 12)

5. Fifth Embodiment: A specific IC configuration and a control example (FIGS. 13 to 29)

Figure 30:
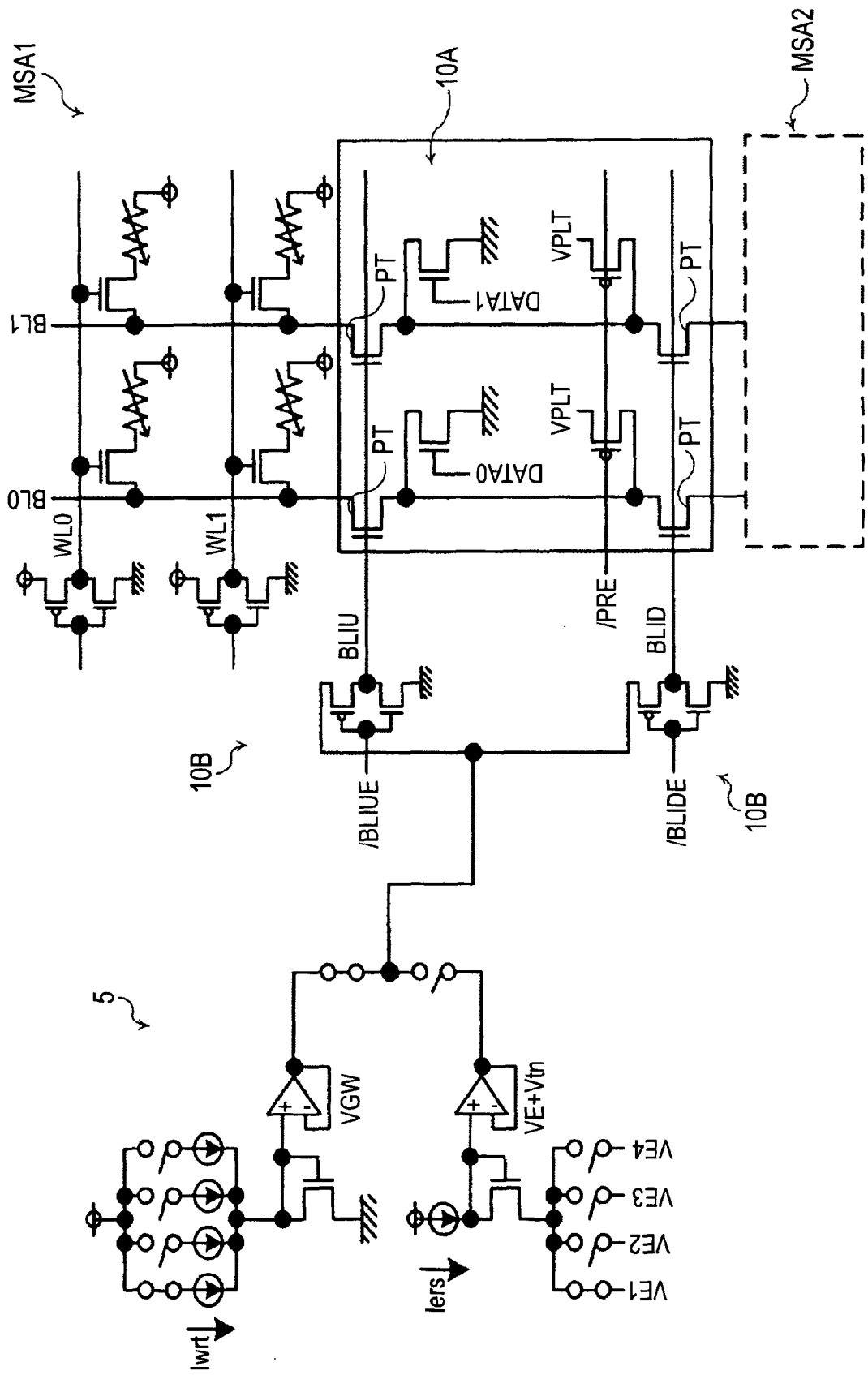
FIG. 30 is an arrangement diagram of a BL driver according to a first modification.

6. First Modification: BL driver arrangement example 1 (FIG. 30)

Figure 31:
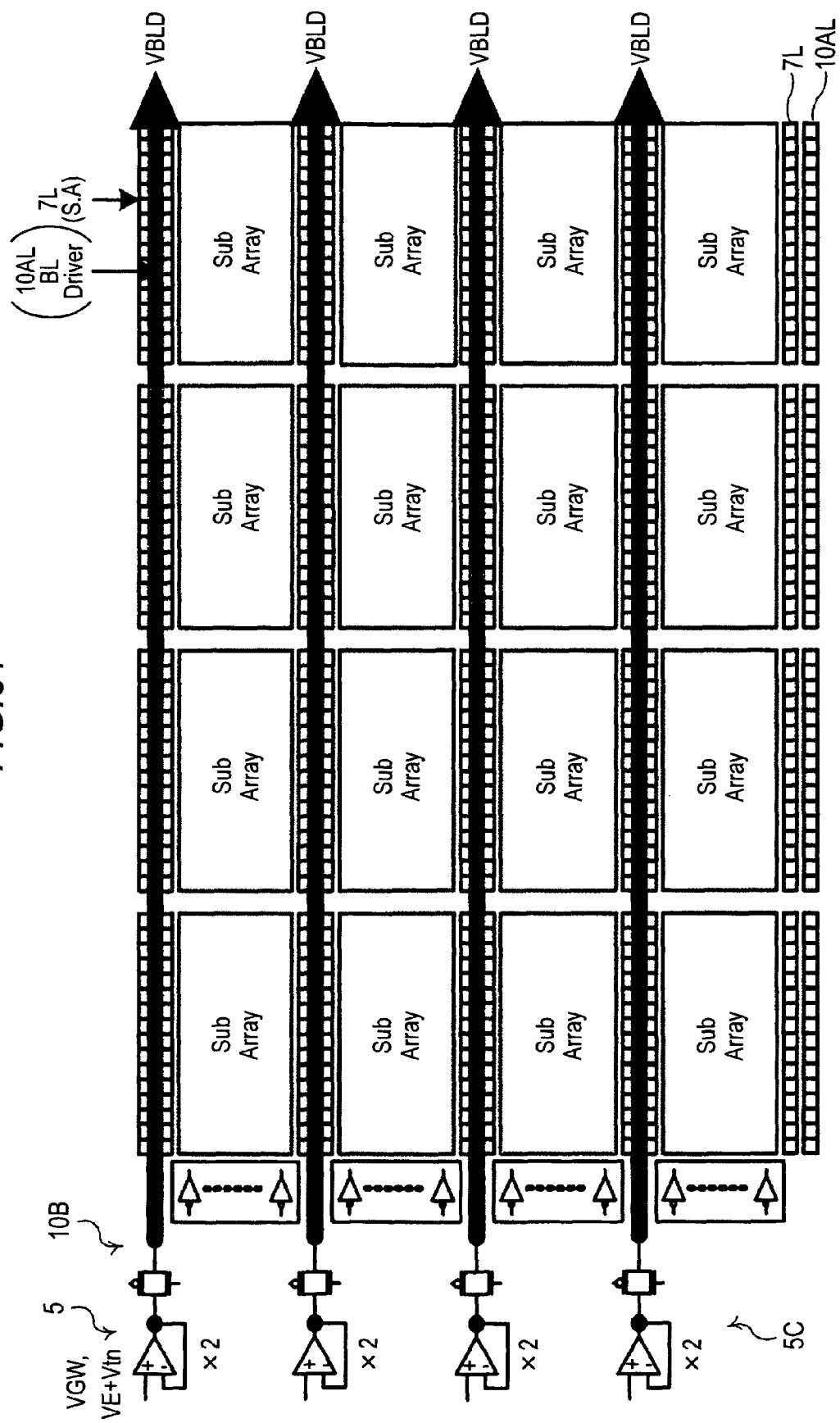
FIG. 31 is an arrangement diagram of a BL driver according to a second modification.

7. Second Modification: BL driver arrangement example 2 (FIG. 31)

Figure 34:
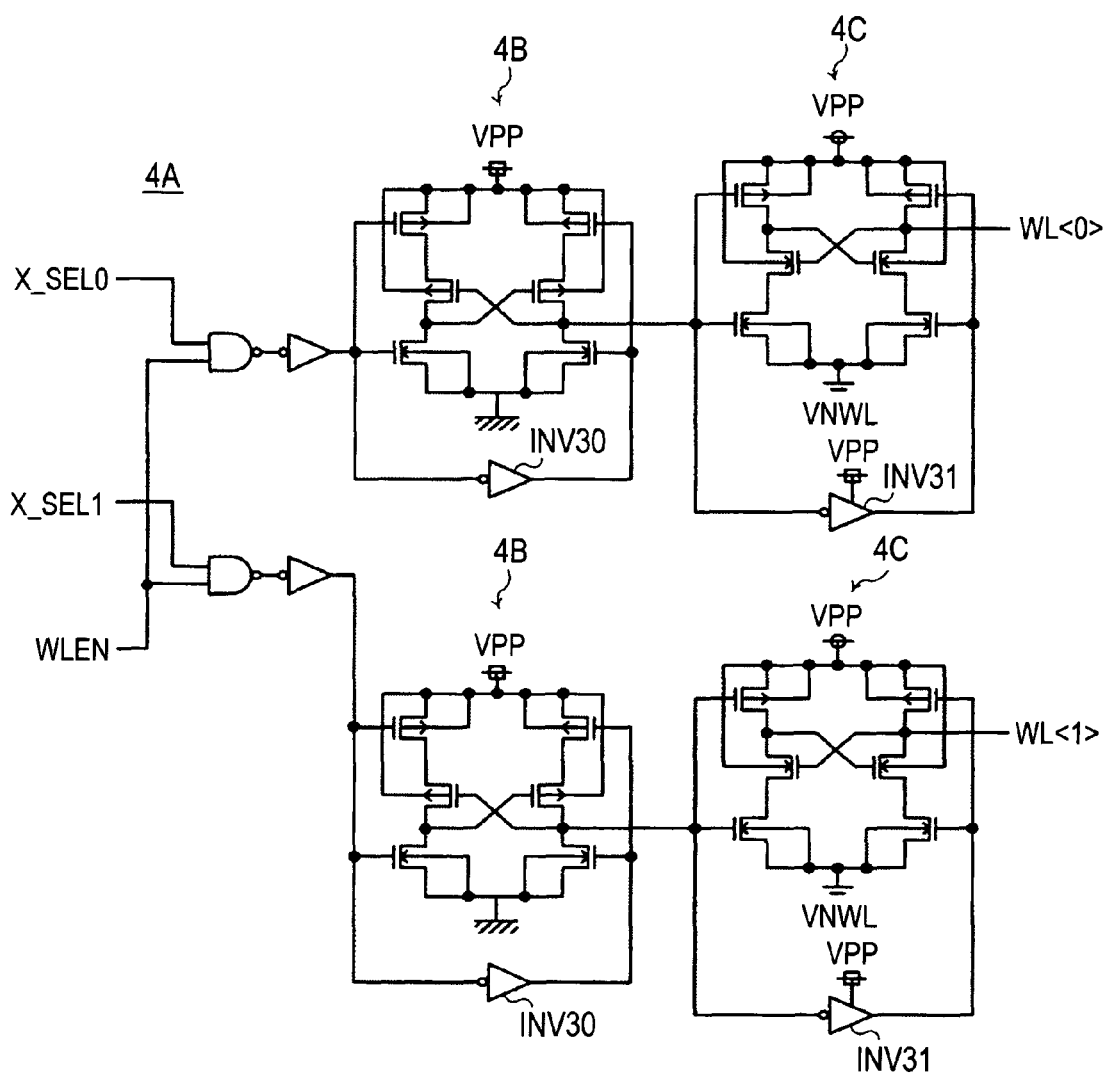
FIG. 34 is a circuit diagram of a WL driver unit according to a third modification.

8. Third Modification: WL driver configuration example (FIG. 34)

1. First Embodiment

Memory Cell Configuration

Figure 1A:
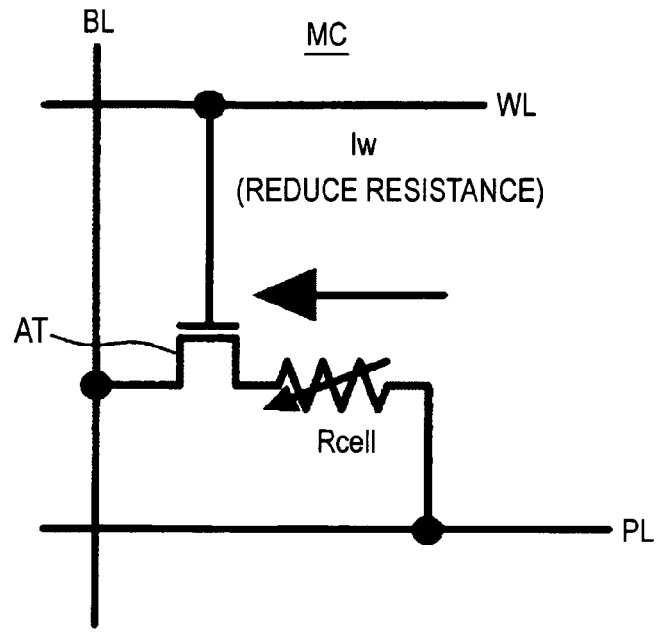
FIGS. 1A and 1B are equivalent circuit diagrams of a memory cell common to first to fifth embodiments and modifications.
Figure 1B:
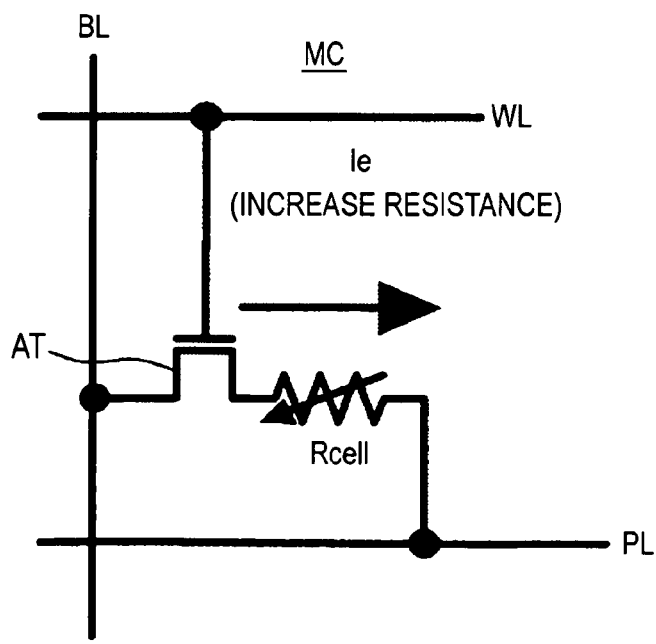

An equivalent circuit of a memory cell common to embodiments of the present invention is shown in FIGS. 1A and 1B. A direction of a write current is shown in FIG. 1A. A direction of an erase current is shown in FIG. 1B. However, a memory cell configuration itself is common to both the figures.

A memory cell MC illustrated in FIGS. 1A and 1B includes one variable cell resistor Rcell as a "memory element" and one access transistor AT.

One end of the variable cell resistor Rcell is connected to a plate line PL and the other end thereof is connected to a source of the access transistors AT. A drain of the access cell transistor AT is connected to a bit line BL and a gate thereof is connected to a word line WL as an "access line".

The bit line BL corresponds to an example of a "first common line" in claims and the plate line PL corresponds to an example of a "second common line" in claims. In FIGS. 1A and 1B, the bit line BL and the plate line PL are orthogonal to each other. However, the bit line BL and the plate line PL may be arranged in parallel to each other.

Figure 2:
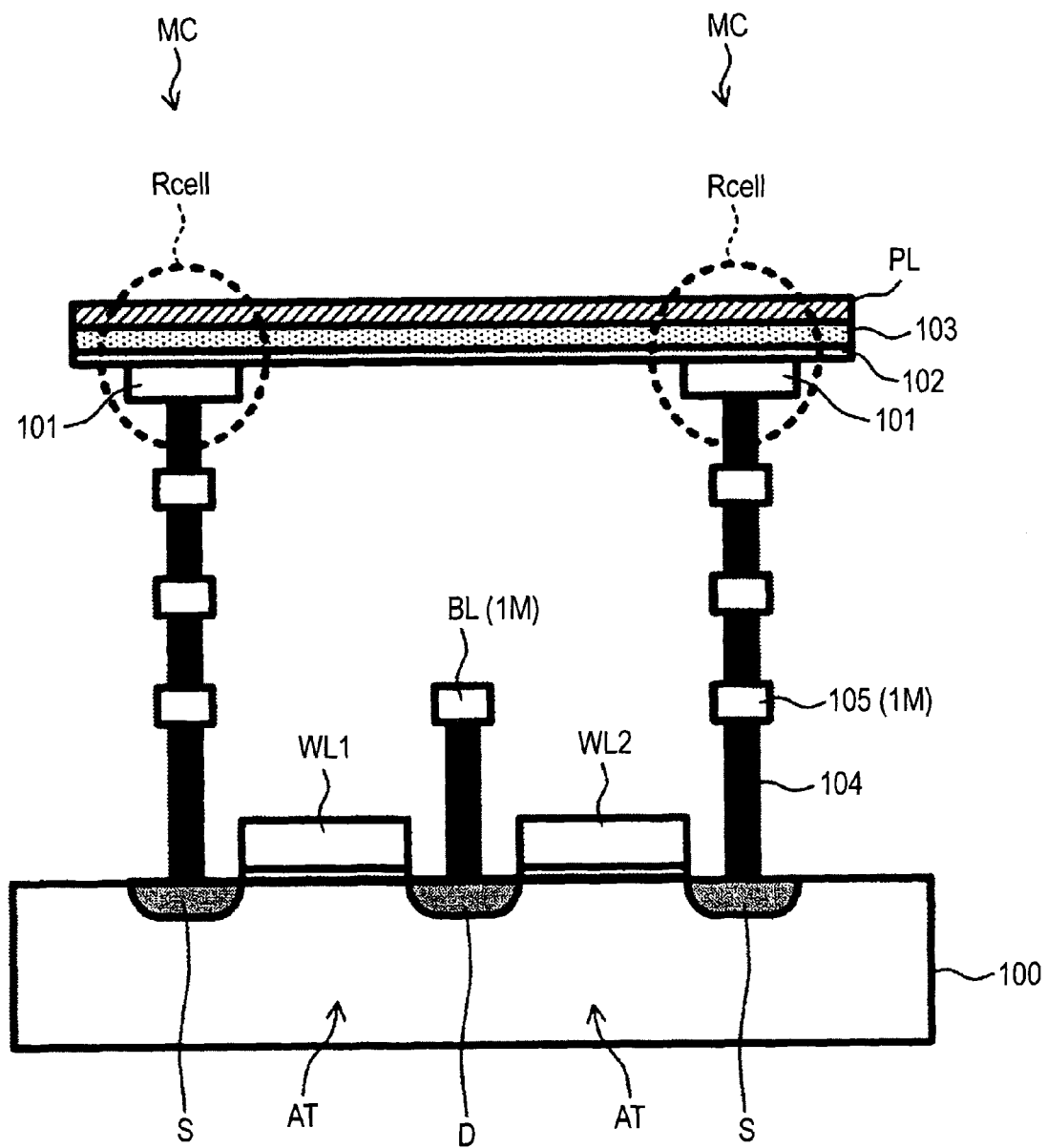
FIG. 2 is a device sectional structure diagram of adjacent two memory cell sections.

The device structure of a section corresponding to adjacent two memory cells MC is shown in FIG. 2. FIG. 2 is a schematic sectional view and is not hatched. Blank sections in FIG. 2 not specifically referred to are filled with insulating films or configure a part of other components.

In the memory cells MC illustrated in FIG. 2, access transistors AT thereof are formed in a semiconductor substrate 100.

More specifically, two impurity regions functioning as a source S and a drain D of the access transistors AT are formed in the semiconductor substrate 100. Gate electrodes made of polysilicon or the like are formed on substrate regions among the impurity regions via gate insulating films. The gate electrodes configure word lines WL1 and WL2.

The drain D is shared by the two memory cells MC and connected to the bit line BL formed by a first wiring layer (1M).

Plugs 104 and landing pads 105 (formed by wiring layers) are repeatedly stacked on the sources S. Variable cell resistors Rcell are formed on the plugs 104 and the landing pads 105. The variable cell resistors Rcell may be formed in any layer of a multilayer wiring structure. However, in the figure, the variable cell resistors Rcell are formed in about fourth to fifth layers.

Each of the variable cell resistors Rcell has a film configuration including an insulator film 102 and a conductor film 103 between a lower electrode 101 and an upper electrode functioning as the plate line PL. The section shown in FIG. 2 is a schematic sectional view of a section where the memory cell shown in FIG. 1A and not-shown another memory cell are connected to the same bit line BL. In this case, the plate line PL is wired in a row direction and the plate line PL is connected in common to a memory cell pair in the row direction.

As explained later, plural plate lines PL may be short-circuited at an edge or on the outside of a memory cell array or the respective plate lines PL may be independently voltage-controlled.

Examples of a material of the insulator film 102 include insulators such as SiN, $SiO_2$, and $Gd_2O_3$.

Examples of a material of the conductor film 103 include a metal film, an alloy film (e.g., a CuTe alloy film), and a metal compound film containing at least one metal element selected out of Cu, Ag, and Zn. Metal elements other than Cu, Ag, and Zn may be used as long as the metal elements have a characteristic that the metal elements are easily ionized. The conductive film 103 is formed as a "supply layer of a conductive ion".

Figure 3A:
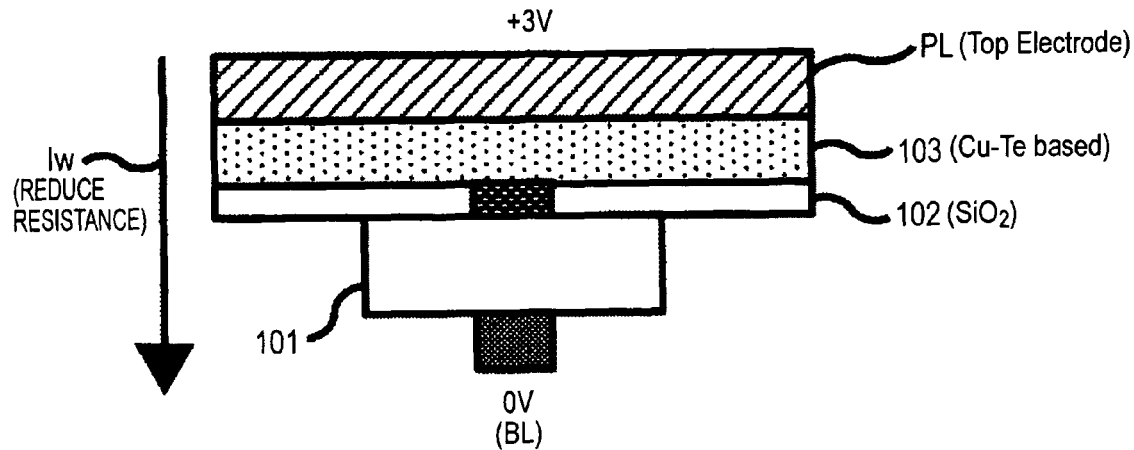
FIGS. 3A and 3B are diagrams of a section and operation of a variable cell resistor (memory element)
Figure 3B:
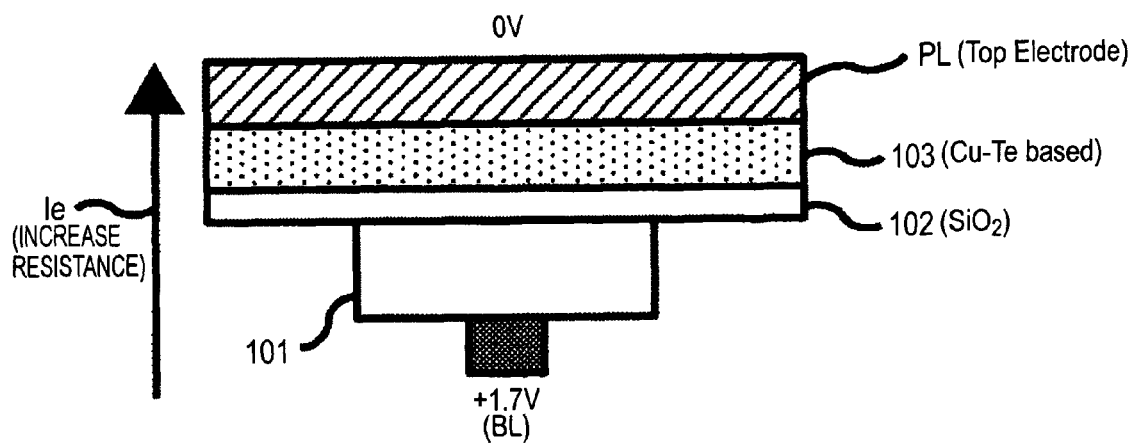

An enlarged diagram of the variable cell resistor Rcell is shown in FIGS. 3A and 3B together with examples of a direction of electric current and an applied voltage value.

In FIGS. 3A and 3B, as an example, the insulator film 102 is formed of $SiO_2$ and the conductive film 103 is formed of a CuTe-alloy based alloy compound (Cu—Te based).

In FIG. 3A, voltage with the insulator film 102 side set as a cathode side and the conductor film 103 side set as an anode side is applied to the lower electrode 101 and the upper electrode (the plate line PL). For example, the bit line BL is grounded at 0 [V] and +3 [V] is applied to the plate line PL.

Then, Cu, Ag, or Zn contained in the conductive film 103 comes to have a characteristic of being ionized and attracted to the cathode side. Conductive ions of the metal are injected into the insulator film 102. Therefore, insulating properties of the insulator film 102 fall. The insulator film 102 comes to have conductive properties according to the fall in the insulating properties. As a result, a write current Iw in a direction shown in FIG. 3A flows. This operation is referred to as write (operation) or set (operation).

Conversely, in FIG. 3B, voltage with the insulator film 102 side set as an anode side and the conductor film 103 side set as a cathode side is applied to the lower electrode 101 and the upper electrode (the plate line PL). For example, the plate line PL is grounded at 0 [V] and +1.7 [V] is applied to the bit line BL.

Then, the conductive ions injected in the insulator film 102 are returned to the conductive film 103 and the insulator film 102 is reset to a high-resistance state before the write. This operation is referred to as erase (operation) or reset (operation). In the reset, an erase current Ie in a direction shown in FIG. 3A flows.

In general, the set means that "sufficiently injecting conductive ions into an insulator film" and the reset means that "sufficiently removing conductive ions from an insulator film".

On the other hand, it is arbitrarily defined which state (the set or the reset) is a data write state or a data erase state.

In the following explanation, a state in which the insulating properties of the insulator film 102 fall and the resistance of the entire variable cell resistor Rcell falls to a sufficient level is associated with the "write" (set) of data. Conversely, a state in which the insulating properties of the insulator film 102 are reset to an initial state and the resistance of the entire variable cell resistor Rcell rises to a sufficient level is associated with the "erase" (reset) of data. Therefore, the insulating film 102 corresponds to an example of a "resistance changing layer" in claims.

An arrow of a circuit symbol of the variable cell resistor Rcell shown in FIGS. 1A and 1B is in a direction same as that of the electric current during the set (during the write).

Figure 4:
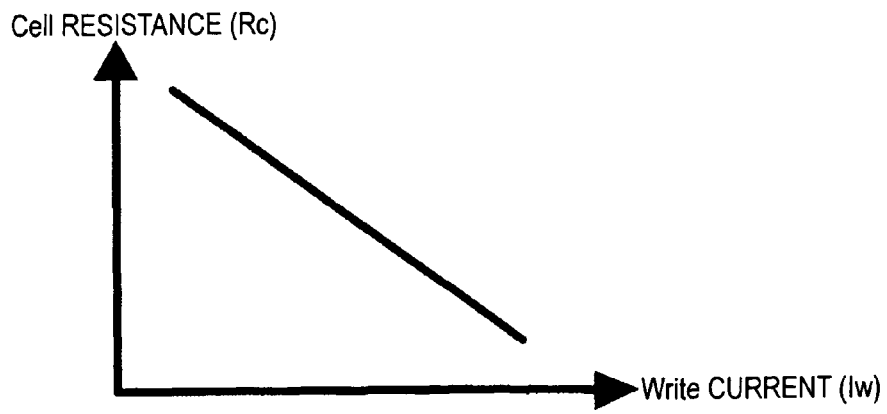
FIG. 4 is a graph of dependency of a cell resistor on a write current.

As shown in FIG. 4, a value of the resistance (hereinafter, cell resistance Rc) of the entire variable cell resistor Rcell changes according to a value of the write current Iw. Since this change has a certain degree of linearity, multi-value storage (storage of ternary or higher values) is also possible by controlling the write current Iw.

A binary memory for irreversibly changing the resistance of the variable cell resistor Rcell between a high resistance state and a low resistance state is realized by repeating the set and the reset. Moreover, since data is stored even if the application of voltage is stopped, the binary memory functions as a nonvolatile memory.

During the set, actually, the resistance of the insulator film 102 changes according to an amount of metal ions in the insulator film 102. Therefore, the insulator film 102 can be regarded as a "storage layer" in which data is stored and held.

A memory cell array of a variable resistance memory can be configured by configuring a memory cell using the variable cell resistor Rcell and providing a large number of memory cells. The variable resistance memory includes the memory cell array and a driving circuit (a peripheral circuit) therefor.

When the write and the erase are repeated multiple times for the variable cell resistor Rcell having the configuration shown in FIGS. 1A and 1B to FIGS. 3A and 3B, the resistance in the low resistance state after the write may change to be lower than an assumed level.

In this embodiment, to compensate for such an unintended change of the resistance involved in data rewriting, a driving circuit configuration for a bit line that can finely adjust bias applied to the memory cells is proposed.

Bit Line Driving Circuit

A driving circuit for a bit line according to the first embodiment is shown in FIGS. 5 and 6 together with the memory cell MC.

The driving circuit illustrated in FIGS. 5 and 6 includes one transistor (hereinafter, common line pass transistor PT) and a control circuit (hereinafter, VBLD driver 5) for a driving gate voltage VBLD of the common line pass transistor PT. The driving circuit includes a BL driver 10A and a plate driver 12.

A drain of the common line pass transistor PT is connected to the bit line BL and a source thereof is connected to the BL driver 10A.

The BL driver 10A is not a driver that drives a bit line voltage as many fine voltages but has a role as a two-power supply switch that simply switches a high level and a low level such as a power supply voltage Vdd and a ground voltage GND. In this regard, the BL driver 10A is different from the bit line driver described in Patent Document 4 both in the circuit size and the role.

On the other hand, the plate driver 12 is connected to the plate line PL.

Like the BL driver 10A, the plate driver 12 has a role as a two-power supply switch that switches a high level and a low level such as the power supply voltage Vdd and the ground voltage GND.

However, the plate driver 12 controls the voltage of the plate line PL in a phase opposite to a phase in which the BL driver 10A controls the voltage of the bit line BL.

Electric currents in opposite directions can be fed to the memory cell MC during the write and during the erase according to such operations of the BL driver 10A and the plate driver 12.

The plate driver 12 and the BL driver 10A correspond to specific examples of a "driving voltage circuit" in claims. The VBLD driver 5 corresponds to a specific example of a "gate driver circuit" in claims.

The VBLD driver 5 roughly includes a current-controlled gate control circuit 5A used during the write in this embodiment, a voltage-controlled gate control circuit 5B used during the erase in this embodiment, and two switches SwA and SwB that switch the outputs of both the gate control circuits.

One end of the switch SwA is connected to the output of the current-controlled gate control circuit 5A and one end of the switch SwB is connected to the output of the voltage-controlled gate control circuit 5B.

Both the other ends of the switches SwA and SwB are connected to a gate of the common line pass transistor PT.

The switch SwA is turned on during the write and turned off during the erase. The switch SwB is turned off during the write and turned on during the erase.

The current-controlled gate control circuit 5A and the voltage-controlled gate control circuit 5B are configured to act as a current mirror driving circuit for the bit line BL to which the common line pass transistor PT feeds a driving current.

More specifically, the current-controlled gate control circuit 5A includes a generation circuit for a write reference current Iwrt (hereinafter, reference-current generating unit 51) in which plural serially-connected circuits of switches and current sources are connected to a positive power supply in parallel to one another. The reference-current generating unit 51 generates different reference current values in the plural current sources. The plural switches are controlled to output one of reference currents Iwrt having the reference current values. The control of the switches is performed by a not-shown control unit.

A drain of an NMOS transistor 52 is connected to a node to which the reference current Iwrt selected by the reference-current generating unit 51 is output. A source of the NMOS transistor 52 is grounded. A gate and the drain of the NMOS transistor 52 are connected in common.

The drain of the NMOS transistor 52 is connected to a non-inverting input "+" of an operational amplifier OP1 functioning as a driver. An inverting input "−" and an output of the operational amplifier OP1 are short-circuited. The output voltage (write control voltage VGW) of the operational amplifier OP1 can be applied to the gate of the common line pass transistor PT via the switch SwA.

The operational amplifier OP1 controls the write control voltage VGW applied to the gate of the common line pass transistor PT such that electric current of a level substantially the same as the reference current Iwrt selected by the reference-current generating unit 51 flows to the bit line BL as the write current Iw.

The voltage-controlled gate control circuit 5B includes a reference-voltage generating unit 53 in which plural switches are respectively connected to input paths for erasing reference voltages VE1 to VE4. The erase reference voltages VE1 to VE4 are applied from a not-shown control circuit or power-supply generating circuit.

In the reference-voltage generating unit 53, the plural switches are controlled to output any one reference voltage among the erase reference voltages VE1 to VE4 (hereinafter referred to as erase reference voltage VE). The control of the switches is performed by a not-shown control unit.

A source of an NMOS transistor 55 is connected to a node to which the reference voltage selected by the reference-voltage generating unit 53 is applied. A current source 54 that feeds an erase reference current Iers is connected between a drain of the NMOS transistor 55 and positive power supply voltage. The drain and a gate of the NMOS transistor 55 are connected in common.

The drain of the NMOS transistor 55 is connected to a non-inverting input "+" of an operational amplifier OP2 functioning as a driver. An inverting input "−" and an output of the operational amplifier OP2 are short-circuited. The output voltage of the operational amplifier OP2 is voltage obtained by adding a threshold voltage Vtn of the NMOS transistor 55 to the erase reference voltage VE. This erase control voltage (VE+Vtn) can be applied to the gate of the common line pass transistor PT via the switch SwB.

The operational amplifier OP2 outputs, irrespective of the level of the erase reference current Iers, the erase control voltage (VE+Vtn) obtained by adding the threshold voltage Vtn of the NMOS transistor 55 to the erase reference voltage VE selected by the reference-voltage generating unit 53.

In FIGS. 5 and 6, reference sign "Icell" indicates the write current Iw or the erase current Ie shown in FIGS. 1A and 1B and FIGS. 3A and 3B. The current is hereinafter referred to as "cell current". Reference sign Vm indicates the voltage of the bit line BL at the time when the cell current Icell flows. The voltage is hereinafter referred to as "bit line operation voltage".

Driving Operation of a Bit Line

The write operation shown in FIG. 5 and the erase operation shown in FIG. 6 are explained below in this order.

As shown in FIG. 5, during the write, the plate driver 12 connects the plate line PL to high-level voltage, for example, the positive power supply voltage. The BL driver 10A connects the source of the common line pass transistor PT to low-level voltage, for example, the ground voltage.

When the word line WL is activated, the cell current Icell (the write current Iw) flows in a direction shown in FIG. 5. The cell current Icell depends on the level of the write control voltage VGW applied from the current-controlled gate control circuit 5A via the switch SwA in the ON state. The cell current Icell changes to mirror current (electric current having a substantially equal level) of the write reference current Iwrt. At this point, the common line pass transistor PT performs drawn-follower operation such that a predetermined current value can be fed.

As shown in FIG. 6, during the erase, the plate driver 12 connects the plate line PL to low-level voltage, for example, the ground voltage. The BL driver 10A connects the source of the common line pass transistor PT to high-level voltage, for example, the positive power supply voltage.

When the word line WL is activated, as shown in FIG. 6, the cell current Icell (the erase current Ie) flows in direction opposite to the direction during the write. The cell current Icell depends on the level of the erase control voltage (VE+Vtn) applied from the voltage-controlled gate control circuit 5B via the switch SwB in the ON state.

The NMOS transistor 55 and the common line pass transistor PT are two NMOS transistors close to each other in the same IC. Therefore, usually, threshold voltages of the NMOS transistors are substantially equal. In this case, the bit line operation voltage Vm is controlled to be substantially equal to the erase reference voltage VE with the threshold voltage of the common line pass transistor PT cancelled.

At this point, the common line pass transistor PT performs source-follower operation such that a desired voltage value can be set in the bit line BL.

When it is desired to change a value of the cell current Icell (the write current Iw) during the write, the not-shown control circuit changes over the switches of the reference-current generating unit 51 to select the current source that feeds a desired current value. When it is desired to change the bit line operation voltage Vm during the erase, the not-shown control circuit changes over the switches of the reference-voltage generating unit 53 to change the input erase reference voltage VE.

When the current and the voltage of the bit line BL can be finely controlled in this way, the word line WL can be driven by a WL driver unit 4A including one inverter shown in FIGS. 5 and 6. The WL driver unit 4A corresponds to an example of an "access control circuit" in claims.

The WL driver unit 4A only has to perform binary voltage driving for a high level and a low level such as the positive power supply voltage and the ground voltage. Therefore, the WL driver unit 4A only has to have a simple configuration.

The word line WL has large wiring load (mainly wiring capacitance) because the word line WL connects a large number of gates of transistors. Therefore, such binary voltage driving contributes to saving in terms of time and energy consumed when the large wiring capacitance of the word line WL is charged and discharged.

According to the first embodiment, advantage explained below can be realized.

During the write, since the common line pass transistor PT performs the drain-follower operation, memory-cell applied current is controlled. During the erase, since the common line pass transistor PT performs the source-follower operation, memory-cell applied voltage is controlled. Therefore, it is easy to set desired current and voltage and highly-accurate driving is possible.

The levels of the electric current and the voltage applied to the memory cells are controlled according to the gate voltage (the driving gate voltage VBLD) of the common line pass transistor PT. In other words, the driving gate voltage VBLD is controlled according to the switching of the write reference current Iwrt and the erase reference voltage VE.

At this point, the wiring loads of the current-controlled gate control circuit 5A and the voltage-controlled gate control circuit 5B that respectively generate the write reference current Iwrt and the erase reference voltage VE can be reduced to be markedly smaller than the wiring load of the bit line BL itself. Therefore, it is possible to switch the write reference current Iwrt and the erase reference voltage VE at high speed.

The driving gate voltage VBLD is controlled according to the outputs of the drivers (the operational amplifiers OP1 and OP2). Therefore, the common line pass transistor PT, for which the bit line BL is the load of output, can switch the output at high speed.

In this embodiment, the voltage level of the power supply voltage line itself is not finely controlled.

In general, since the power supply voltage line reduces impedance, wiring load is increases. Therefor, it is difficult to perform high-speed voltage transition.

In this system, the voltage of the bit line BL is controlled according to the high-speed control of the gate voltage of the common line pass transistor Pt. In this system, it is possible to adopt a configuration for causing the access transistor AT to perform switching operation by gate voltage control thereof to switch whether to apply power supply voltage without changing a value of the driving voltage (power supply voltage) of the word line WL.

Therefore, high-speed operation is possible in both the bit line BL driving and the word line WL driving.

Moreover, since the access transistor AT acts as a mere switch, the WL driver unit 4A can be simplified as an inverter configuration.

2. Second Embodiment

A driving circuit for a bit line according to a second embodiment of the present invention is shown in FIGS. 7 and 8 together with the memory cell MC. FIG. 7 corresponds to write time and FIG. 8 corresponds to erase time.

When FIG. 7 is compared with FIG. 5, a voltage relation between the BL driver 10A and the plate driver 12 is reversed and, therefore, the direction of the cell current Icell is also opposite. Similarly, when FIG. 8 is compared with FIG. 6, a voltage relation between the BL driver 10A and the plate driver 12 is reversed and, therefore, the direction of the cell current Icell is also opposite.

According to the change explained above, the switch SwB is on and the switch SwA is off during the write in FIG. 7. The voltage-controlled gate control circuit 5B contributes to the generation of the driving gate voltage VBLD.

Conversely, the switch SwA is on and the switch SwB is off during the erase in FIG. 8. The current-controlled gate control circuit 5A contributes to the generation of the driving gate voltage VBLD.

Concerning a change of names, in FIGS. 7 and 8, the current sources in the reference-current generating unit 51 feed the erase reference current Iers and the current source 54 feeds the write reference current Iwrt. The operational amplifier OP1 outputs an erase control voltage VGE and the operational amplifier OP2 outputs a write control voltage (VW+Vtn).

As explained above, in the second embodiment, a correspondence relation between the drain-follower operation and the source-follower operation of the common line pass transistor PT and the set (write) and the reset (erase) is opposite to that in the first embodiment.

In other words, in this embodiment, the source-follower operation is executed during the write and the drain-follower operation is executed during the erase.

The other components and operations and advantages to be obtained are the same as those in the first embodiment.

3. Third Embodiment

A driving circuit for a bit line according to a third embodiment of the present invention is shown in FIGS. 9 and 10 together with the memory cell MC. FIG. 9 corresponds to write time and FIG. 10 corresponds to erase time.

When FIG. 9 is compared with FIG. 5 and FIG. 10 is compared with FIG. 6, the common line pass transistor PT is changed from the NMOS type to the PMOS type. The configuration of the VBLD driver 5 is also changed for PMOS driving.

More specifically, the NMOS transistors 52 and 55 are respectively changed to PMOS transistors 56 and 57. The direction of the current sources in the reference-current generating unit 51 is changed to a direction for inducing the erase reference current Iers out from the transistor (the PMOS transistor 56). Similarly, the direction of the current source 54 is changed to a direction for inducing the write reference current Iwrt out from the transistor (the PMOS transistor 57).

The switch SwB is on and the switch SwA is off during the write in FIG. 9. The voltage-controlled gate control circuit 5B contributes to the generation of the driving gate voltage VBLD.

Conversely, the switch SwA is on and the switch SwB is off during the erase in FIG. 10. The current-controlled gate control circuit 5A contributes to the generation of the driving gate voltage VBLD.

Concerning a change of names, in FIGS. 9 and 10, the current sources in the reference-current generating unit 51 feed the erase reference current Iers and the current source 54 feeds the write reference current Iwrt. The operational amplifier OP1 outputs the erase control voltage VGE and the operational amplifier OP2 outputs the write control voltage (VW+Vtp). The reference sign "Vtp" indicates the threshold voltage of the PMOS transistors.

In the third embodiment, the common line pass transistor PT is changed to the PMOS type, the set (write) is performed in the source-follower operation, and the reset (erase) is performed in the drain-follower operation. This is different from the first embodiment.

The other components and operations and advantages to be obtained are the same as those in the first embodiment.

4. Fourth Embodiment

A driving circuit for a bit line according to a fourth embodiment of the present invention is shown in FIGS. 11 and 12 together with the memory cell MC. FIG. 11 corresponds to write time and FIG. 12 corresponds to erase time.

When FIG. 11 is compared with FIG. 9, a voltage relation between the BL driver 10A and the plate driver 12 is reversed and, therefore, the direction of the cell current Icell is also opposite. Similarly, when FIG. 12 is compared with FIG. 10, a voltage relation between the BL driver 10A and the plate driver 12 is reversed and, therefore, the direction of the cell current Icell is also opposite.

According to the change explained above, the switch SwA is on and the switch SwB is off during the write in FIG. 11. The current-controlled gate control circuit 5A contributes to the generation of the driving gate voltage VBLD.

Conversely, the switch SwB is on and the switch SwA is off during the erase in FIG. 12. The voltage-controlled gate control circuit 5B contributes to the generation of the driving gate voltage VELD.

Concerning a change of names, in FIGS. 11 and 12, the current sources in the reference-current generating unit 51 feed the write reference current Iwrt and the current source 54 feeds the erase reference current Iers. The operational amplifier OP1 outputs the write control voltage VGW and the operational amplifier OP2 outputs an erase control voltage (VE+Vtp).

In the fourth embodiment, the common line pass transistor PT is changed to the PMOS type. However, the set (write) is performed in the drain-follower operation and the reset (erase) is performed in the source-follower operation. This is the same as the first embodiment.

The other components and operations and advantages to be obtained are the same as those in the first embodiment.

5. Fifth Embodiment

A fifth embodiment of the present invention illustrates a more detailed IC chip configuration of a memory device. In this embodiment, the first embodiment is explained more in detail. Thereafter, modifications to the second to fourth embodiments are explained.

IC chip Configuration

Figure 13:
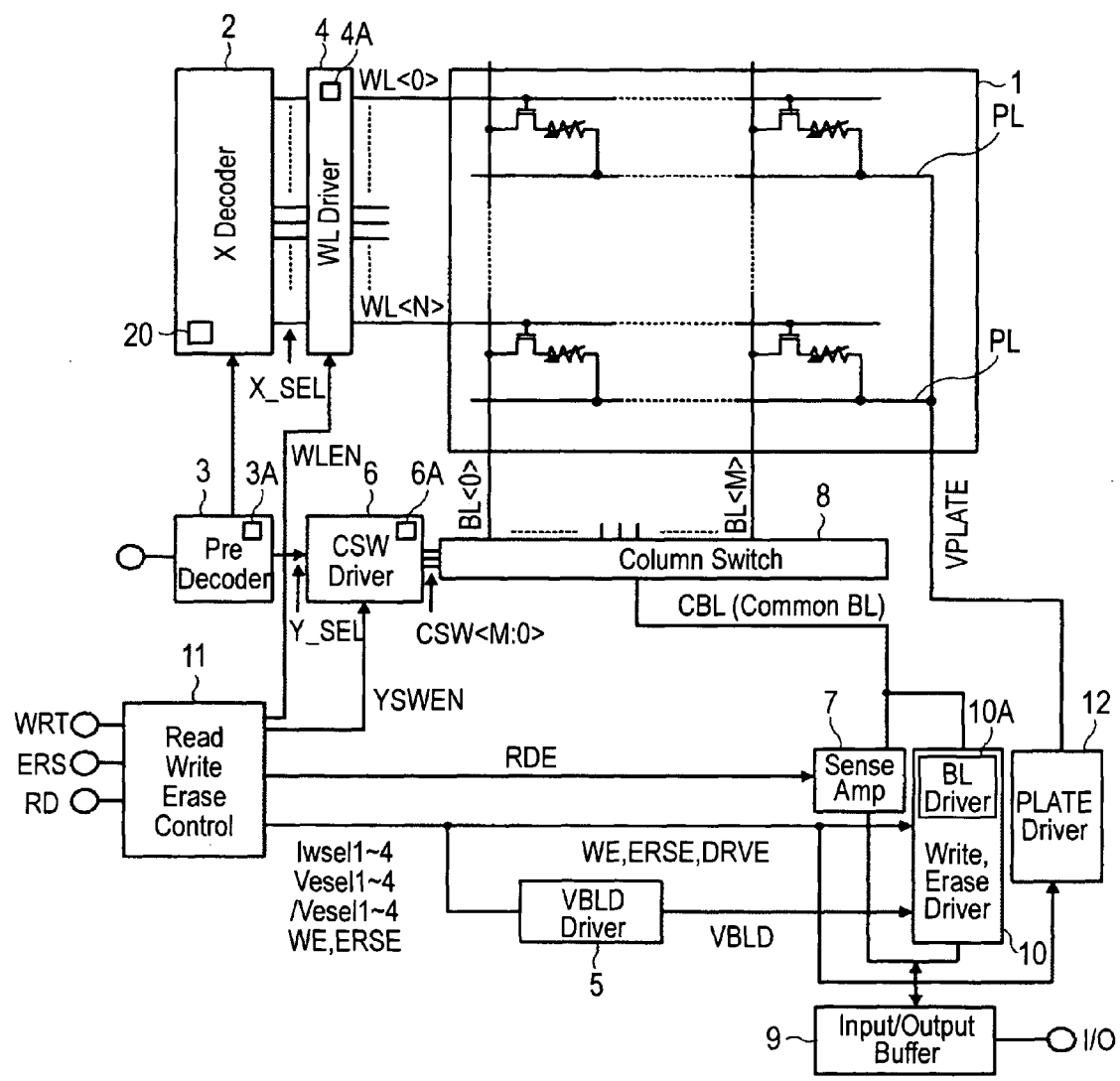
FIG. 13 is a block diagram of an IC chip according to a fifth embodiment of the present invention.

A block diagram of an IC chip according to the fifth embodiment is shown in FIG. 13.

A semiconductor memory illustrated in the figure includes a memory cell array 1 in which the memory cell MC shown in FIGS. 1A and 1B to FIGS. 3A and 3B is arranged in a matrix shape, i.e., (N+1) memory cells MC are arranged in a row direction and (M+1) memory cells MC are arranged in a column direction, and a peripheral circuit of the memory cell array 1. "N" and "M" are relatively large natural numbers. Specific values thereof are arbitrarily set.

In the memory cell array 1, (N+1) word lines WL<0> to WL<N>, which commonly connect gates of the access transistors AT respectively in (N+1) memory cells MC arranged in a row direction, are arranged in a column direction at predetermined intervals. (N+1) bit lines BL<0> to BL<N>, which commonly connect drains of the access transistors AT respectively in (N+1) memory cells MC arranged in the column direction, are arranged at predetermined intervals in the row direction.

(N+1) plate lines PL, which commonly connect nodes on the opposite side of the access transistor AT of the variable cell resistor Rcell in the row direction, are arranged at predetermined intervals in the column direction. One ends of the (N+1) plate lines PL are made common and drawn out to the outside of the memory cell array 1.

The plate lines PL may be arranged long in the column direction. The number of plate lines PL may be (M+1).

As shown in FIG. 13, the peripheral circuit includes an X (address) decoder (X decoder) 2, a pre-decoder 3 also serving as a Y (address) decoder, a WL driver 4, the VBLD driver 5, and a CSW driver 6. Further, the peripheral circuit includes a sense amplifier (sense amp) 7, a column switch 8, an I/O buffer (input/output buffer) 9, a write and erase driver 10, a control circuit 11, and the plate driver 12.

The X decoder 2 is configured with an X selector 20 as a basic unit. The X decoder 2 is a circuit that decodes an X address signal input from the pre-decoder 3 and sends an X select signal X_SEL selected based on a result of the decoding to the WL driver 4. Details of the X selector 20 are explained later.

The pre-decoder 3 separates an input address signal (Address) into an X address signal and a Y address signal. The pre-decoder 3 sends the X address signal to the X decoder 2. The pre-decoder 3 decodes the Y address signal with a Y decoding unit.

The Y decoding unit of the pre-decoder 3 is configured with a Y selector 30 as a basic unit. The pre-decoder 3 is a circuit that decodes the input Y address signal and sends a Y select signal Y_SEL selected based on a result of the decoding to the CSW driver 6. Details of the Y selector 30 are explained later.

The WL driver 4 includes (N+1) WL driver units 4A for each of word lines WL. A corresponding one word line among (N+1) word lines WL<0> to WL<N> is connected to outputs of the respective WL driver units 4A. One of the WL driver units 4A is selected according to the X select signal X_SEL input from the X decoder 2. The WL driver unit 4A is a circuit that, when selected, applies predetermined voltage to the word line WL connected to the output thereof. Details of the WL driver unit 4A are explained later.

The CSW driver 6 is configured with a CSW driver unit 6A as a basic unit. The CSW driver 6 is a circuit that generates, according to the input Y select signal Y_SEL, a Y switch signal YSW (and an inverted signal thereof when necessary) as a signal for controlling the column switch 8. Details of the CSW driver unit 6A are explained later.

The column switch 8 is a set of switches including NMOS transistors alone. Alternatively, the column switch 8 is a set of transmission gates (TG) in which NMOS transistors and PMOS transistors are connected to each other in sources and drains thereof. The switches are connected for each of the bit lines BL. (N+1) switches are formed in total.

One output line of the column switch 8 is called "common bit line CBL".

The sense amplifier 7 and the write and erase driver 10 are connected to the common bit line CBL. A configuration example of the sense amplifier 7 and the write and erase driver 10 is explained later. The sense amplifier 7 and the write and erase driver 10 are connected to the I/O buffer 9. Data from the outside can be written in the sense amplifier 7 and the write and erase driver 10 through the I/O buffer 9 and the write and erase driver 10. Data read out by the sense amplifier 7 can be discharged to the outside via the I/O buffer 9.

The VBLD driver 5 is the circuit illustrated in the first to fourth embodiments. A more realistic circuit example is explained later.

The control circuit 11 receives the input of a write signal WRT, an erase signal ERS, and a data readout signal RD and operates based on these three signals.

The control circuit 11 has four functions explained below.

(1) A readout control function for controlling the sense amplifier 7

(2) A write control function for controlling the plate driver 12 and the write and erase driver 10 during the write (3) A word line control function for controlling the WL driver 4 during the write and during the readout (4) A column switch control function for controlling the column switch 8 via the CSW driver 6 during the write and during the readout Only reference signs of various control signals output by the control circuit 11 are shown in FIG. 13. Details of the control signals are explained later.

A circuit that generates various voltages from a power supply voltage, a generation control circuit for a clock signal, and the like are not shown in the figure.

Control System Circuit

The X selector 20 as the basic configuration of the X decoder 2 and the Y selector 30 as the basic configuration of the Y decoder function of the pre-decoder 3 are explained below. Then, the WL driver unit 4A as the basic configuration of the WL driver 4 and the CSW driver unit 6A as the basic configuration of the CSW driver 6 are explained.

Figure 14:
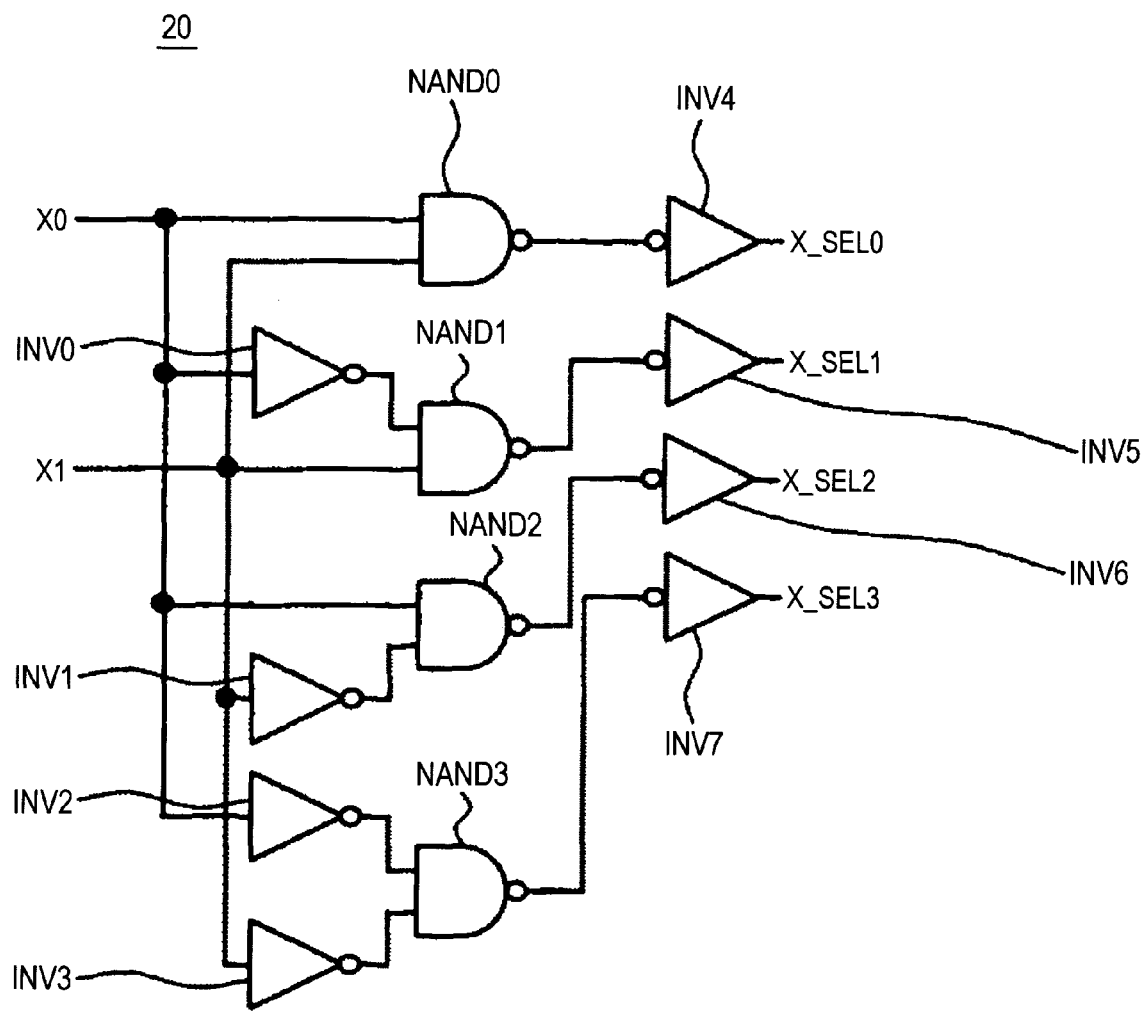
FIG. 14 is a circuit diagram of an X selector.

The circuit example of the X selector 20 is shown in FIG. 14.

The X selector 20 illustrated in FIG. 14 includes four inverters INV0 to INV3 in a first stage, four NAND circuits NAND0 to NAND3 in a middle stage, and four inverters INV4 to INV7 connected to a post stage.

The X selector 20 is a circuit that receives the input of X address bits X0 and X1 and activates (e.g., to a high level) any one of the X select signals X_SEL0 to X_SEL3 according to a decoding result of the X address bits X0 and X1.

FIG. 14 is an example of 2-bit decode. If the configuration shown in FIG. 13 is extended or expanded in multiple stages according to the number of bits of an X address signal input thereto, the X decoder 2 is realized to be applicable even when input is other than 2-bit input.

Figure 15:
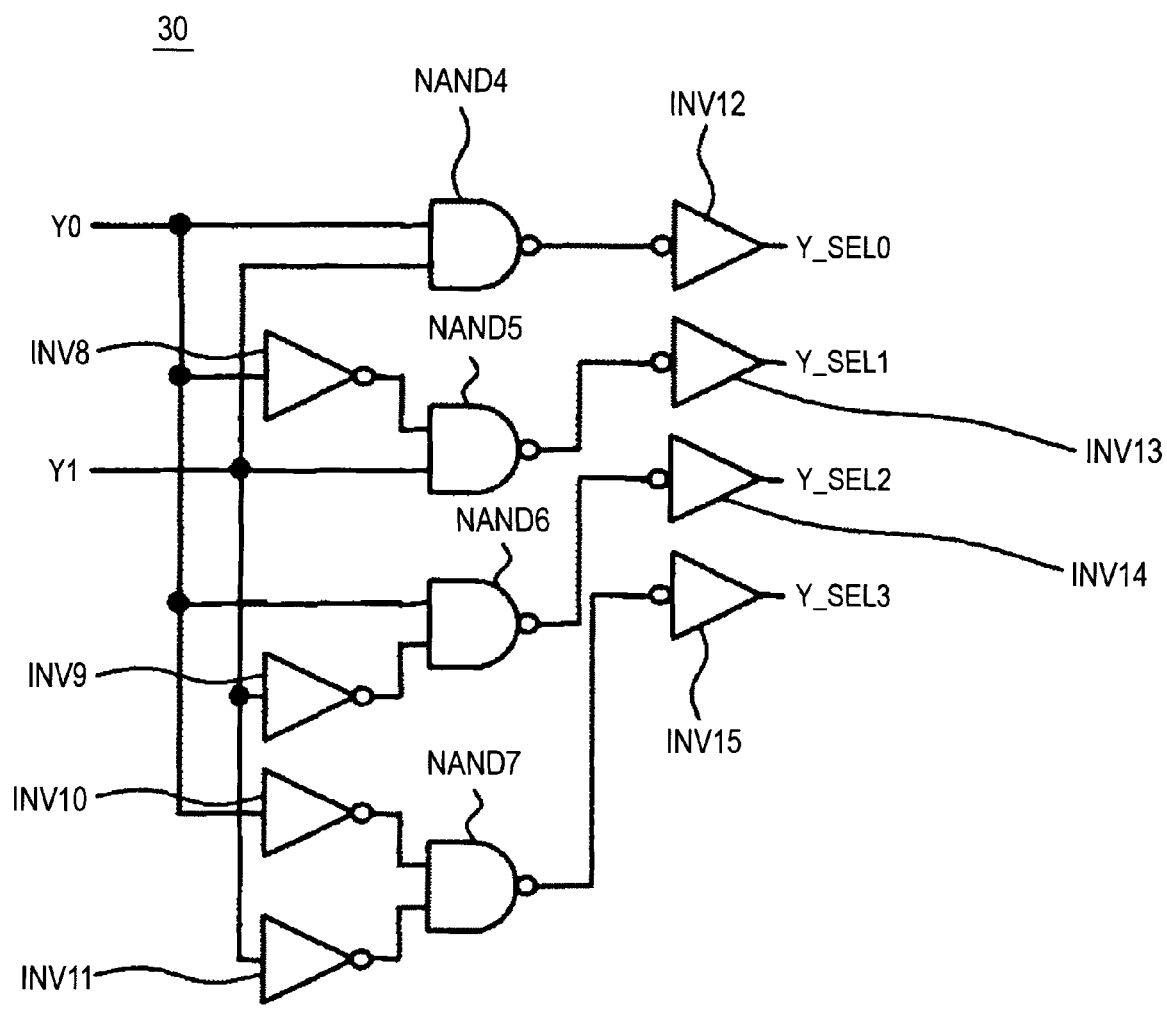
FIG. 15 is a circuit diagram of a Y selector.

A circuit example of the Y selector 30 is shown in FIG. 15.

The Y selector 30 illustrated in FIG. 15 includes four inverters INV8 to INV11 in a first stage, four NAND circuits NAND4 to NAND7 in a middle stage, and four inverters INV12 to INV15 connected to a post stage.

The Y selector 30 is a circuit that receives the input of Y address bits Y0 and Y1 and activates (e.g., to a high level) any one of the Y select signals Y_SEL0 to Y_SEL3 according to a decoding result of the Y address bits Y0 and Y1.

FIG. 15 is an example of 2-bit decode. If the configuration shown in FIG. 15 is extended or expanded in multiple stages according to the number of bits of a Y address signal input thereto, the pre-decoder 3 is realized to be applicable even when input is other than 2-bit input.

Figure 16:
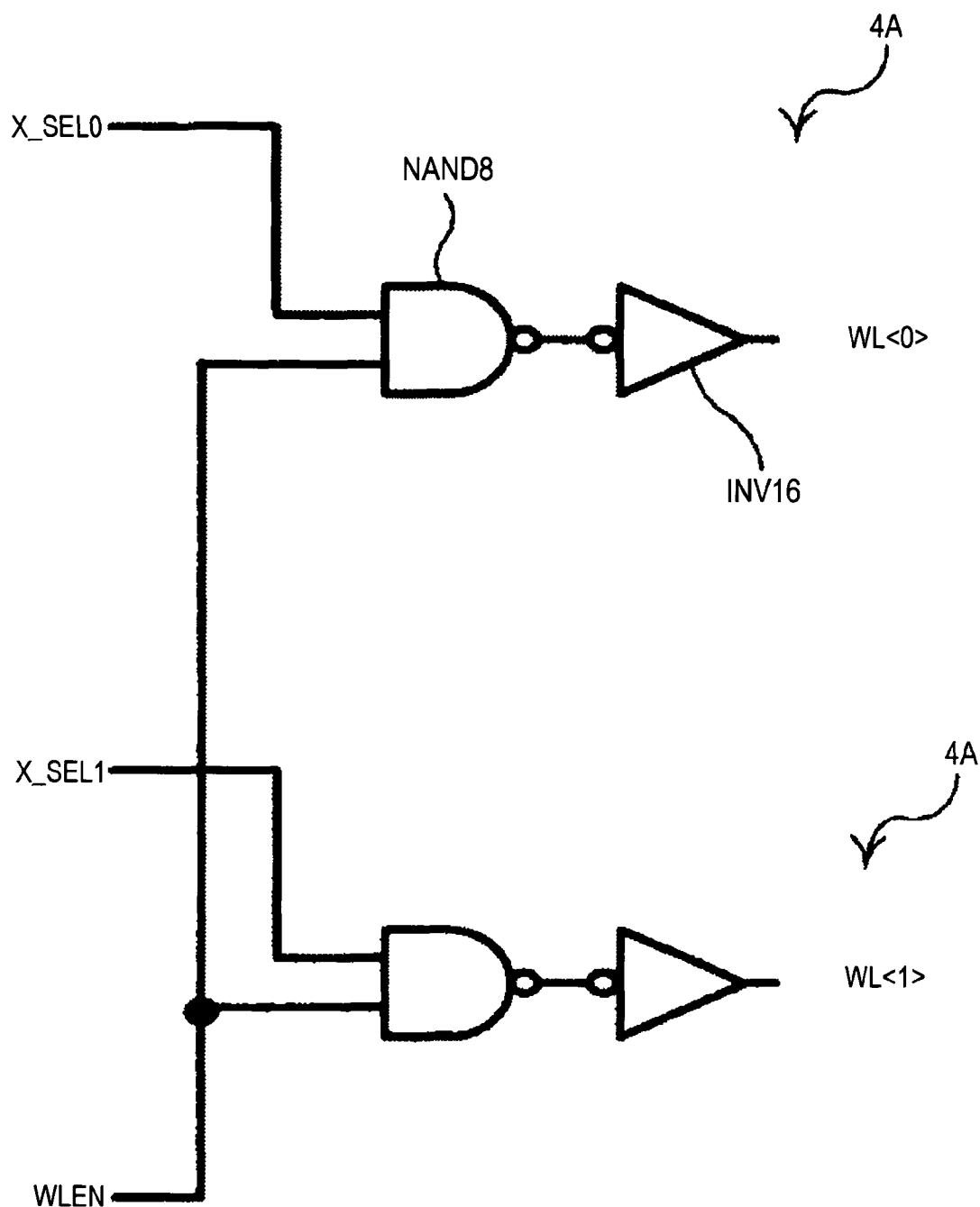
FIG. 16 is a circuit diagram of two WL driver units.

FIG. 16 is a circuit diagram of two WL driver units 4A.

The WL driver units 4A illustrated in the figure are provided in the column direction in the WL driver 4 by the number of cells (N+1) (see FIG. 13).

The (N+1) WL driver units 4A operate according to one X select signal X_SEL0 or X_SEL1 selected (activated) by the X selector 20 or the like shown in FIG. 14. The WL driver unit 4A activates one word line WL<0> or WL<1> corresponding to the X select signal X_SEL0 or X_SEL1.

Each of the WL driver unit 4A illustrated in FIG. 16 includes a NAND circuit NAND8 and an inverter INV16.

A WL selection enable signal WLEN is input to one input of the NAND circuit NAND8, the X select signal X_SEL0 or X_SEL1 is input to the other input, and an output of the NAND circuit NAND8 is connected to an input of the inverter INV16. The word line WL<0> or WL<1> connected to an output of the inverter INV16 is activated or inactivated.

Figure 17:
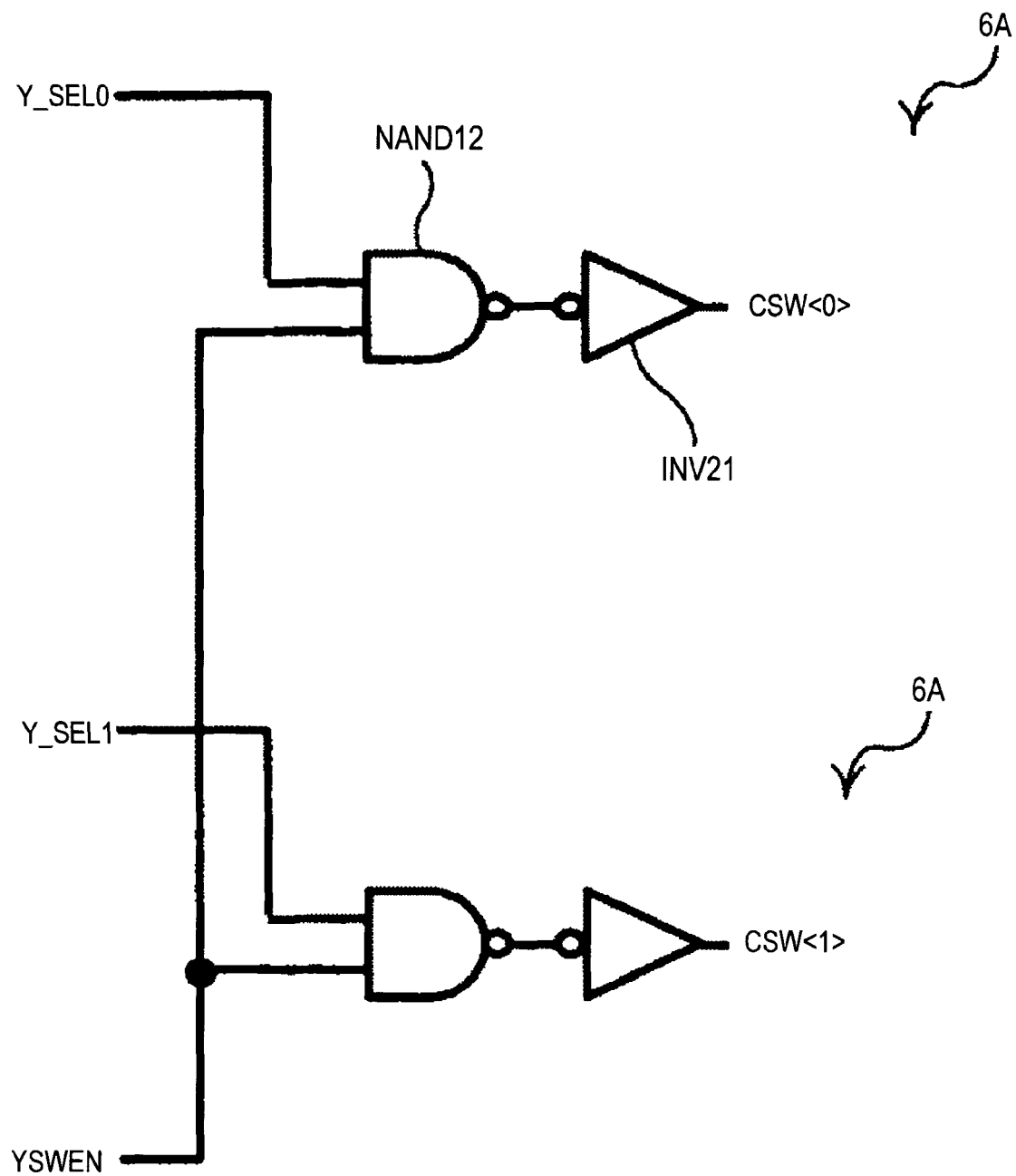
FIG. 17 is a circuit diagram of a CSW driver unit.

A circuit example of the CSW driver unit 6A is shown in FIG. 17.

The CSW driver unit 6A illustrated in the figure includes a NAND circuit NAND12 and an inverter INV21 connected to an output of the NAND circuit NAND12.

A Y switch enable signal YSWEN is input to one input of the NAND circuit NAND12 and one Y select signal Y_SEL0 or Y_SEL1 selected (activated) by the Y selector 30 shown in FIG. 15 is input to the other input. When both of the Y select signal Y_SEL0 or Y_SEL1 and the Y switch enable signal YSWEN are active (at the high level), the output of the NAND circuit NAND12 is at the low level. Therefore, a column selection line CSW<0> or CSW<1> connected to an output of the inverter INV21 transitions to an active level (in this example, the high level).

The column selection lines CSW<0>, CSW<1>, and the like are represented as "CSW<M:0>" in FIG. 13 and are input to the column switch 8.

The WL selection enable signal WLEN shown in FIG. 16 and the Y switch enable signal YSWEN shown in FIG. 17 are generated by the control circuit 11 shown in FIG. 13 and respectively given to the row decoder 4 and the CSW driver 6.

The control circuit 11 receives the input of the write signal WRT, the erase signal ERS, and the data readout signal RD and generates various control signals besides the WL selection enable signal WLEN and the Y switch enable signal YSWEN.

Sense Amplifier

Figure 18:
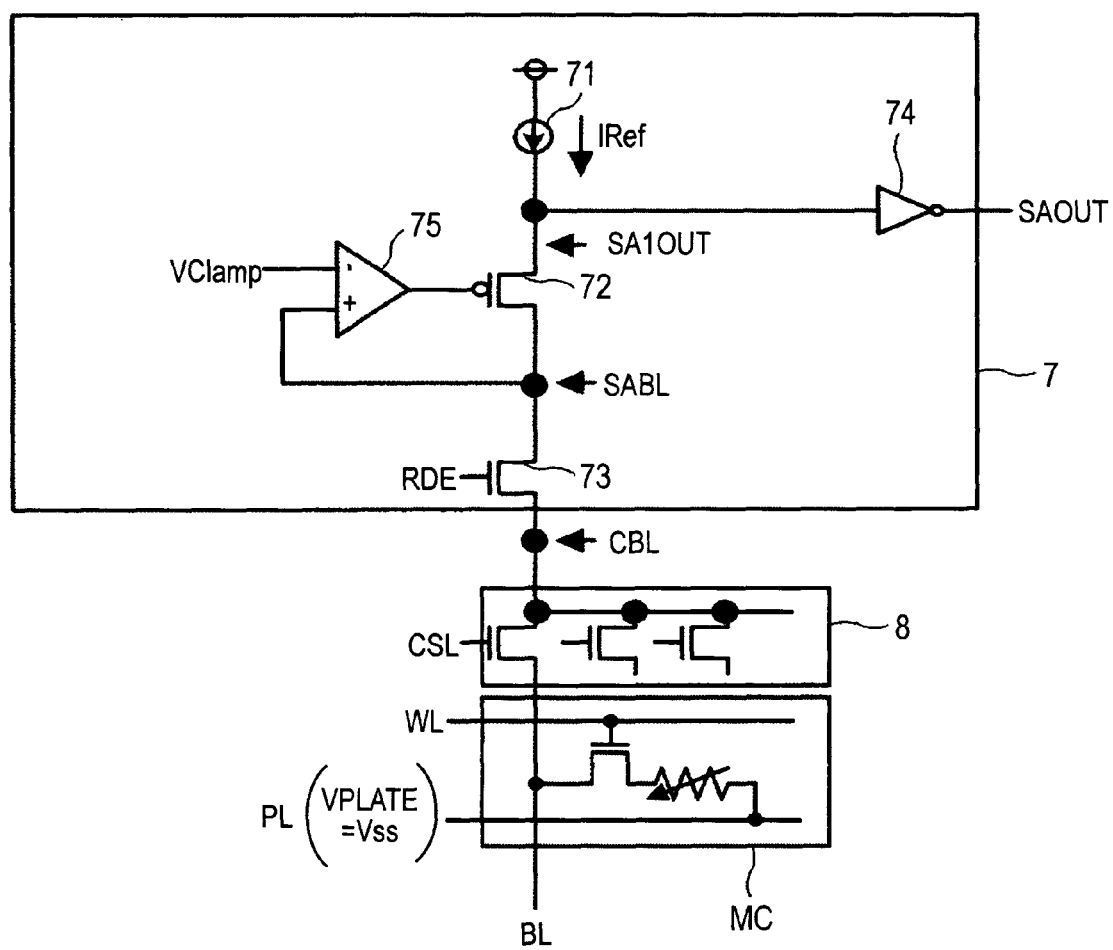
FIG. 18 is a first diagram of a sense amplifier.

A first configuration example of the sense amplifier 7 is shown in FIG. 18.

In the sense amplifier 7 illustrated in FIG. 18, a current source 71 that feeds a reference current IRef and NMOS transistors 72 and 73 are serially connected between a positive power supply voltage and the common bit line CBL.

The sense amplifier 7 includes a sense unit 74 that senses the potential of a connection node between the current source 71 and the NMOS transistor 72 and an operational amplifier 75 that controls the gate voltage of the NMOS transistor 72.

In the operational amplifier 75, a clamp voltage VClamp (stored voltage of a not-shown capacitor, etc.) is input to a non-inverting input "+". The clamp voltage VClamp is changeably stored. An inverting input "−" of the operational amplifier 75 is connected to a source of the NMOS transistor 72 and an output thereof is connected to a gate of the NMOS transistor 72, whereby the operational amplifier 75 forms a negative feedback amplifier of a voltage-follower type.

In FIG. 18, a plate voltage indicated by reference sign "VPLATE" is applied to the plate line PL connected to the memory cell MC. As shown in FIG. 13, the plate voltage VPLATE is generated by the plate driver 12 and simultaneously supplied to all the plate lines PL.

In a circuit shown in FIG. 18, a reference voltage Vss (e.g., ground voltage) is applied to the plate line PL as the plate voltage VPLATE.

In readout operation of the circuit shown in FIG. 18, electric current is fed into the memory cell MC from the sense amplifier 7. In this operation, electric current in a direction same as that of the erase current Ie flows to the memory cell MC. Therefore, it is necessary to carry out the readout operation with voltage application that is weak enough for not erasing data in the memory cell MC.

The applied voltage to the memory cell MC is determined by controlling the potential (SABL potential) of the common bit line CBL.

As shown in FIG. 18, the NMOS transistor 72 and the operational amplifier 75 form a negative feedback circuit of the voltage-follower type and limit the SABL potential to the Vclamp potential. When memory cell resistance is represented as Rcell, a cell readout current depends on "Vclamp/Rcell".

At this point, the current source 71 operates to feed the reference current IRef from the sense amplifier 7 to the memory cell MC. However, only the cell readout current depending on Vclamp/Rcell flows to the memory cell MC. Therefore, unbalance occurs between the cell readout current and the reference current IRef. The unbalance causes a change in the drain potential (sense node potential SA1OUT) of the NMOS transistor 72. The drain potential change of the NMOS transistor 72 is amplified by the sense unit 74 such as an inverter. The amplified potential change (signal) is output to the outside via the I/O buffer 9 shown in FIG. 13. This amplified readout signal is hereinafter referred to as SA output signal SAOUT.

Figure 19:
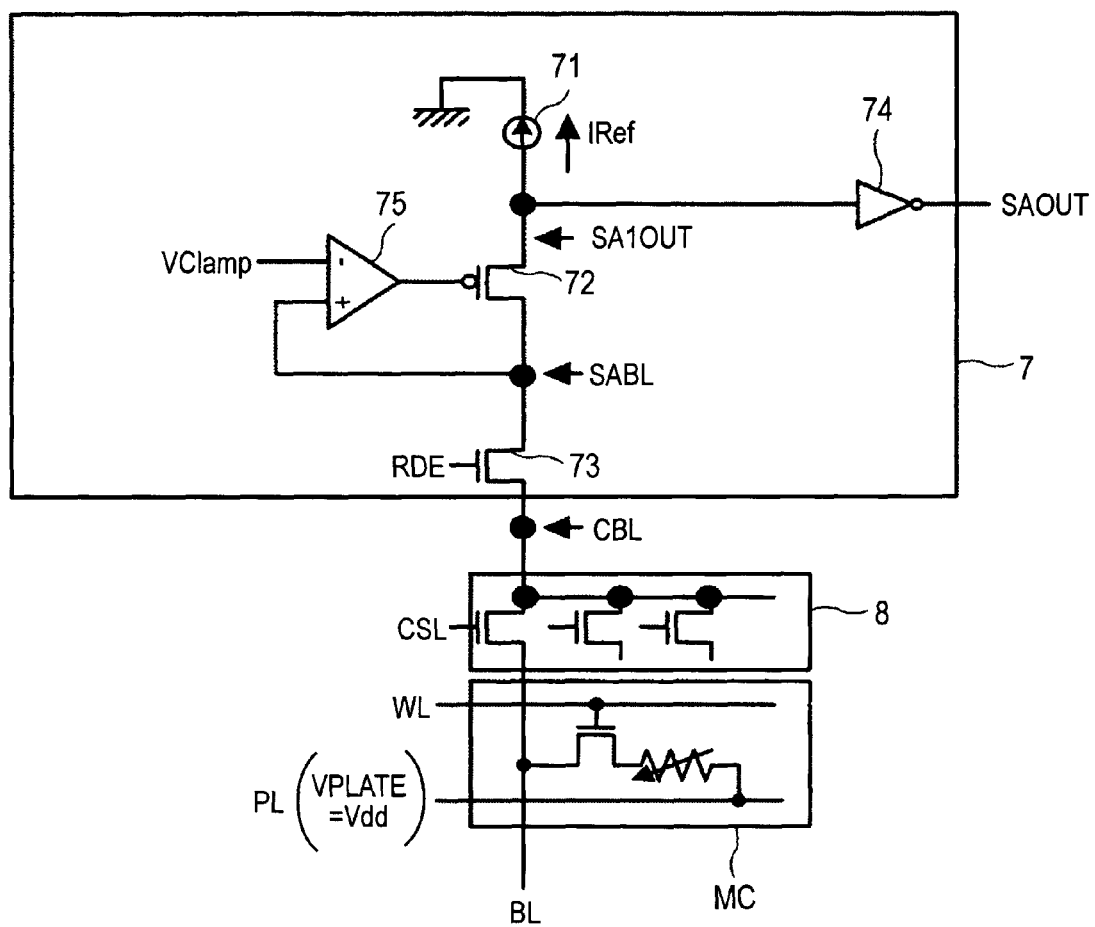
FIG. 19 is a second diagram of a sense amplifier (a modification)

The sense amplifier 7 shown in FIG. 18 and the operation thereof can be changed as shown in FIG. 19.

As shown in FIG. 19, the plate voltage VPLATE is set to a positive power supply voltage, for example, the power supply voltage Vdd and the current source 71 is connected between the sense node and the reference voltage (e.g., the ground voltage). The NMOS transistor 72 is changed to a PMOS configuration and the connection of the input of the operational amplifier 75 is reversed from that shown in FIG. 18.

Consequently, a readout cell current in a direction same as the direction of the write current Iw flows to the memory cell MC. However, a cell applied voltage needs to be weak enough for preventing the write such that stored data is not rewritten.

Even in such a direction of bias application, readout data corresponding to the cell resistance Rc of the memory cell MC can be obtained.

VBLD Driver

Figure 20:
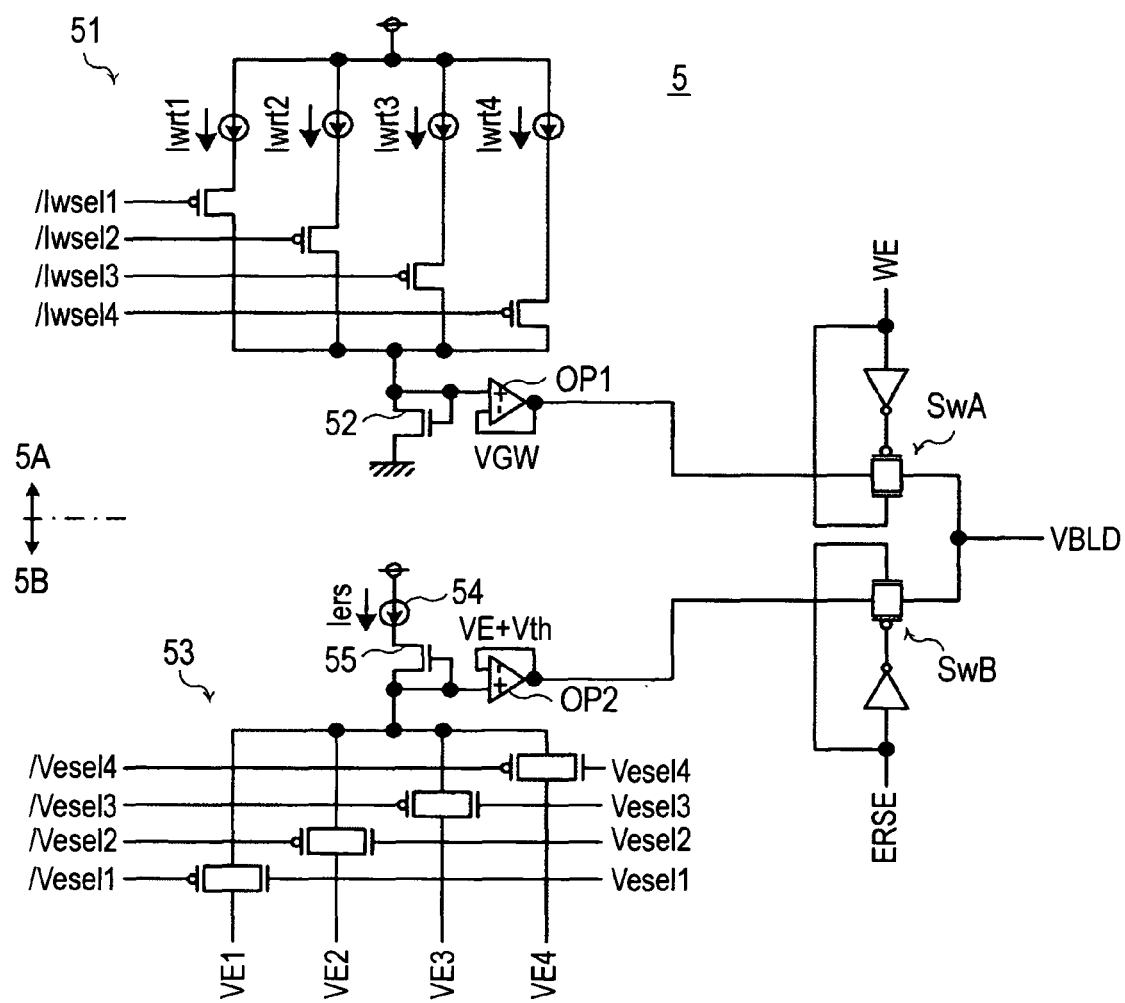
FIG. 20 is a circuit diagram of a VBLD driver corresponding to the first embodiment.
Figure 21:
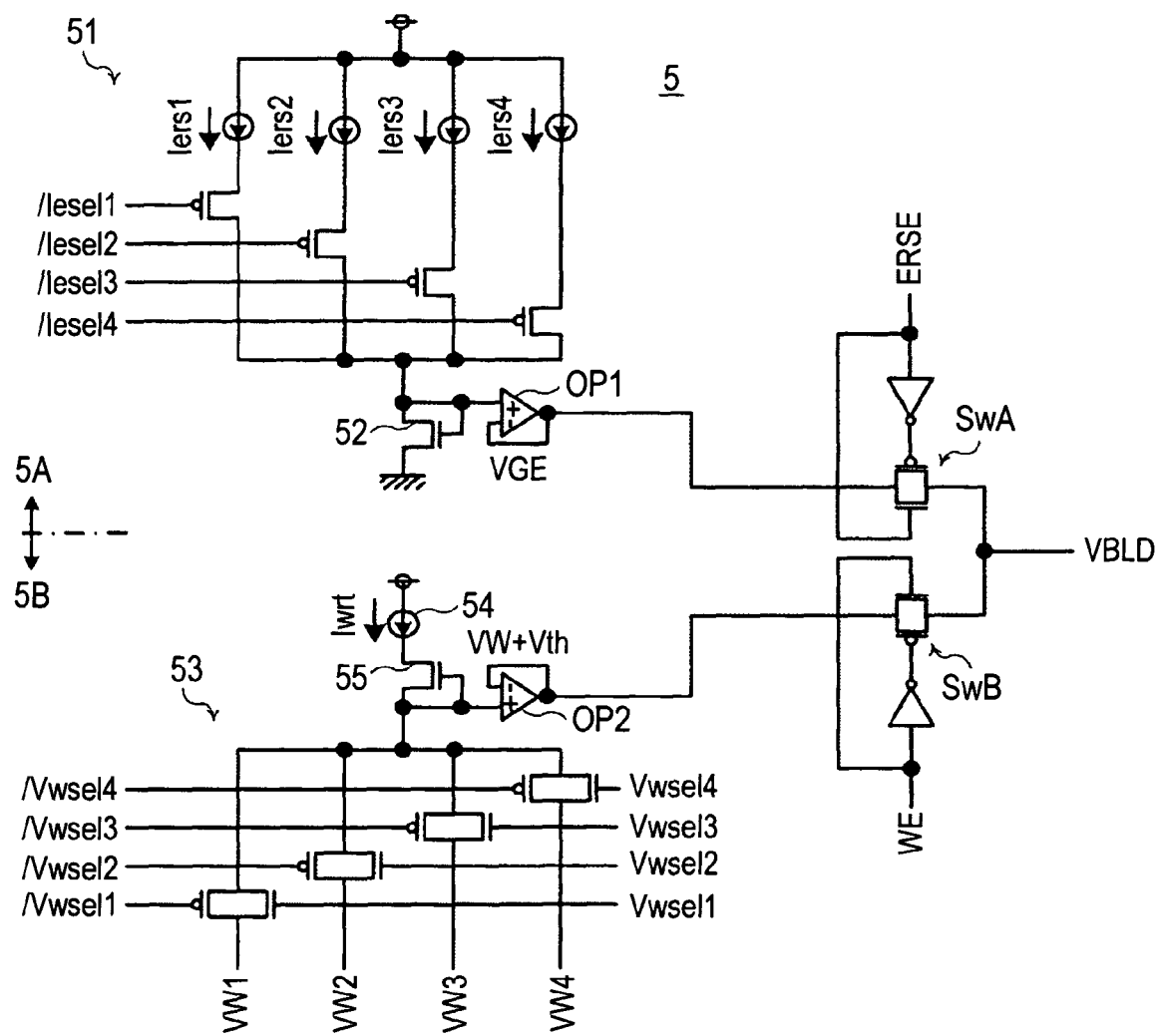
FIG. 21 is a circuit diagram of a VBLD driver corresponding to the second embodiment.
Figure 22:
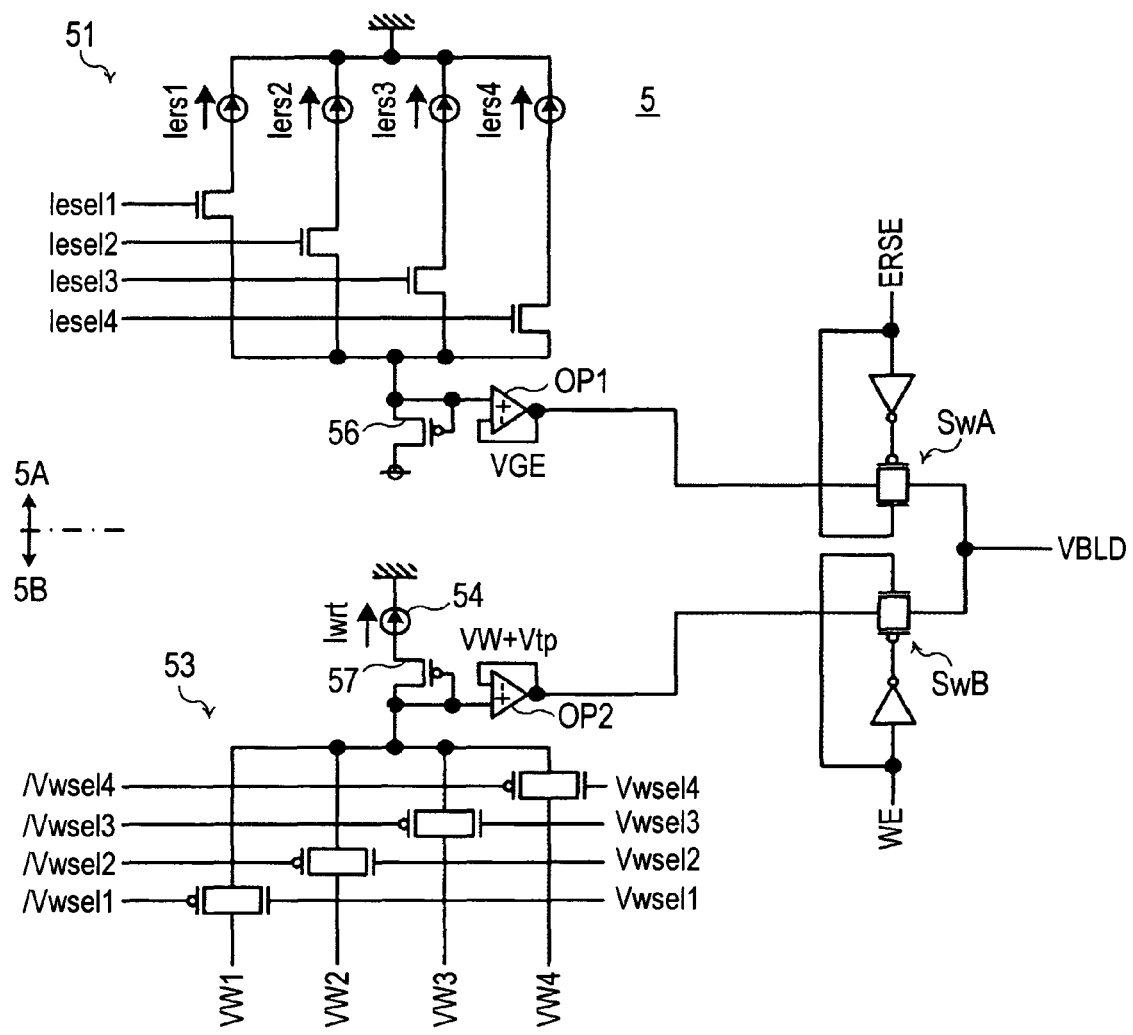
FIG. 22 is a circuit diagram of a VBLD driver corresponding to the third embodiment.
Figure 23:
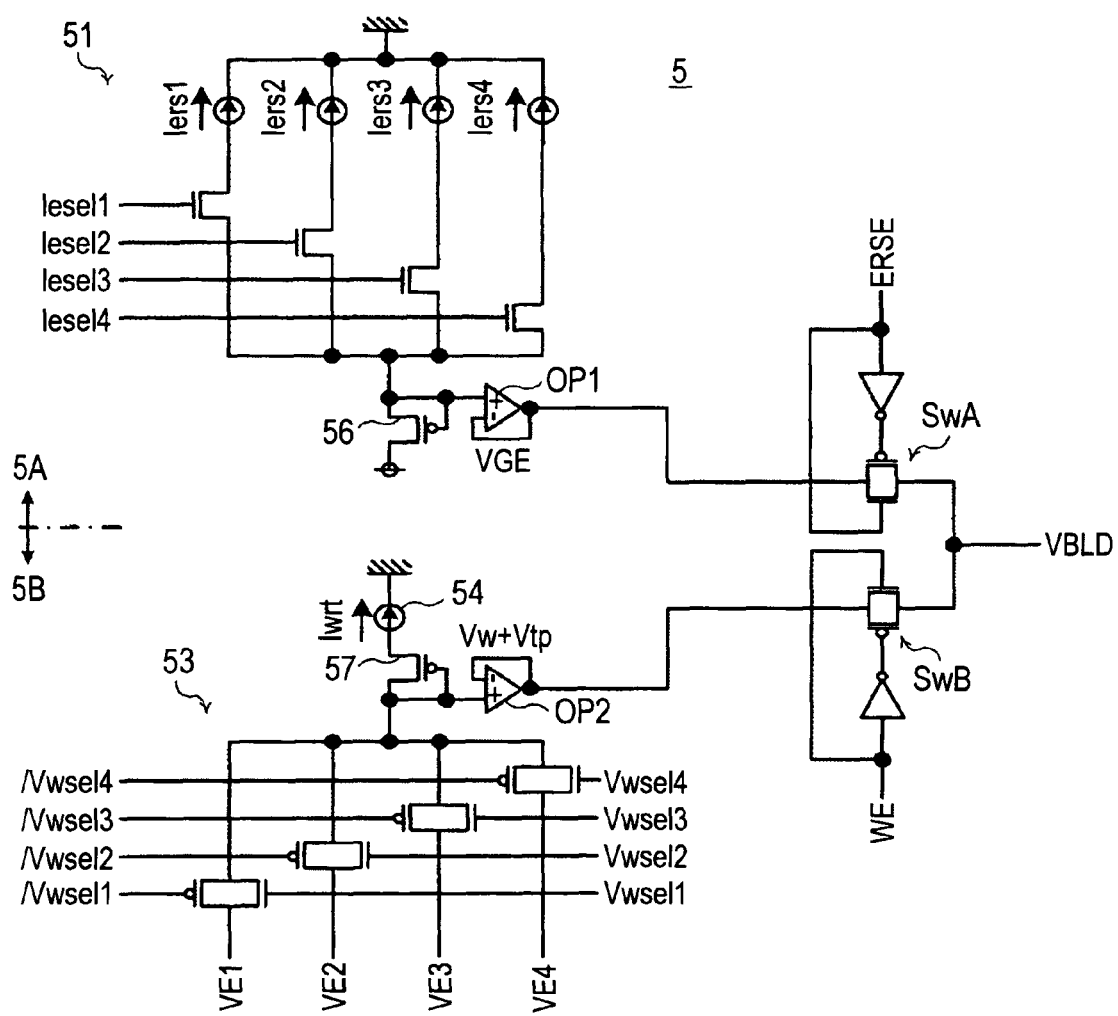
FIG. 23 is a circuit diagram of a VBLD driver corresponding to the fourth embodiment.

A more specific example of a VBLD driver circuit corresponding to the first embodiment is shown in FIG. 20. More specific examples of a VBLD driver circuit corresponding to the second to fourth embodiments are shown in FIGS. 21 to 23.

In FIGS. 20 to 23, components same as those shown in FIGS. 5 to 12 are denoted by the same reference numerals and signs.

If one circuit shown in FIGS. 20 to 23 is explained, configurations and operations of other circuits can be easily estimated from the descriptions in the first to fourth embodiments. The configuration and the operation shown in FIG. 20 corresponding to the first embodiment are explained below as representative configuration and operation.

The VBLD driver 5 illustrated in FIG. 20 adopts a system in which the reference-current generating unit 51 and the reference-voltage generating unit 53 switch the write reference current Iwrt and the erase reference voltage VE in four stages. However, the number of control stages is not limited and a number other than four can be arbitrarily adopted.

In the reference-current generating unit 51, the write reference current Iwrt is determined by changing over four PMOS switches based on selection signals /Iwsel1 to /Iwsel4 generated and applied by the control circuit 11 shown in FIG. 13. Specifically, four current sources respectively corresponding to the four PMOS switches are set to feed write reference currents Iwrt1 to Iwrt4. One PMOS switch is turned on based on the selection signals /Iwsel1 to /Iwsel4. Consequently, a reference current flowing through the turned-on PMOS switch is selected as the write reference current Iwrt.

The reference-current generating unit 51 feeds a bias current value depending on the write reference current Iwrt to the NMOS transistor 52, buffers voltage generated in the drain (and the gate) of the NMOS transistor 52 with the driver (the operational amplifier OP1), and generates the write control voltage VGW.

In the reference-voltage generating unit 53, the erase reference current Iers is determined by changing over four TG switches based on selection signals Vesel1 to Vesel4 generated and applied by the control circuit 11 shown in FIG. 13 and inverted signals (/Vesel1 to Vesel4) thereof. Specifically, one of the four input voltages (erase reference voltages VE1 to VE4) is input via the TG switches turned on based on selection signals /Iesel1 to /Iesel4 and inverted signals (/Vesel1 to Vesel4) thereof. Consequently, the erase reference voltage VE is selected and applied to the source of the NMOS transistor 55.

The reference-voltage generating unit 53 feeds a bias current value depending on the erase reference current Iers generated by the current source 54 to the NMOS transistor 55. When voltage generated in the source (and the gate) of the NMOS transistor 55 at that point is buffered by the driver (the operational amplifier OP2), the erase control voltage (VE+Vtn) is generated.

The output of the driver (the operational amplifier OP1) is input to the TG switch (SwA). The TG switch (SwA) is controlled according to a write enable signal WE applied from the control circuit 11 shown in FIG. 13 and an inverter-inverted signal thereof.

The output of the driver (the operational amplifier OP2) is input to the TG switch (SwB). The TG switch (SwB) is controlled according to an erase enable signal ERSE given from the control circuit 11 shown in FIG. 13 and an inverter-inverted signal thereof.

One of the TG switches (SwA) and (SwB) is selected or both the TG switches are not selected. The driving gate voltage VBLD is generated in a node where the outputs of the TG switches (SwA) and (SwB) merge.

In this circuit configuration, a current path that changes electric current or voltage in order to generate the driving gate voltage VELD is formed by circuits with light load such as the reference-current generating unit 51 and the NMOS transistor 52 or the current source 54, the NMOS transistor 55, and the reference-voltage generating unit 53. Since the potential of a node provided along the current path with light load is generated by switching, according to a control signal, electric current to be fed and voltage to be applied, switching of the node potential is quick.

On the other hand, when the common line pass transistor PT is connected to the bit line BL and the large number of common line pass transistors PT are simultaneously driven, a gate line of the common line pass transistor PT has relatively large load.

In this circuit configuration, when the gate line of the common line pass transistor PT having relatively large load is driven, the node potential along the current path having light load is output after being once buffered to be imparted with a strong drive ability. Therefore, the control of the common line pass transistor PT is also quick.

Write and Erase Driver

Figure 24:
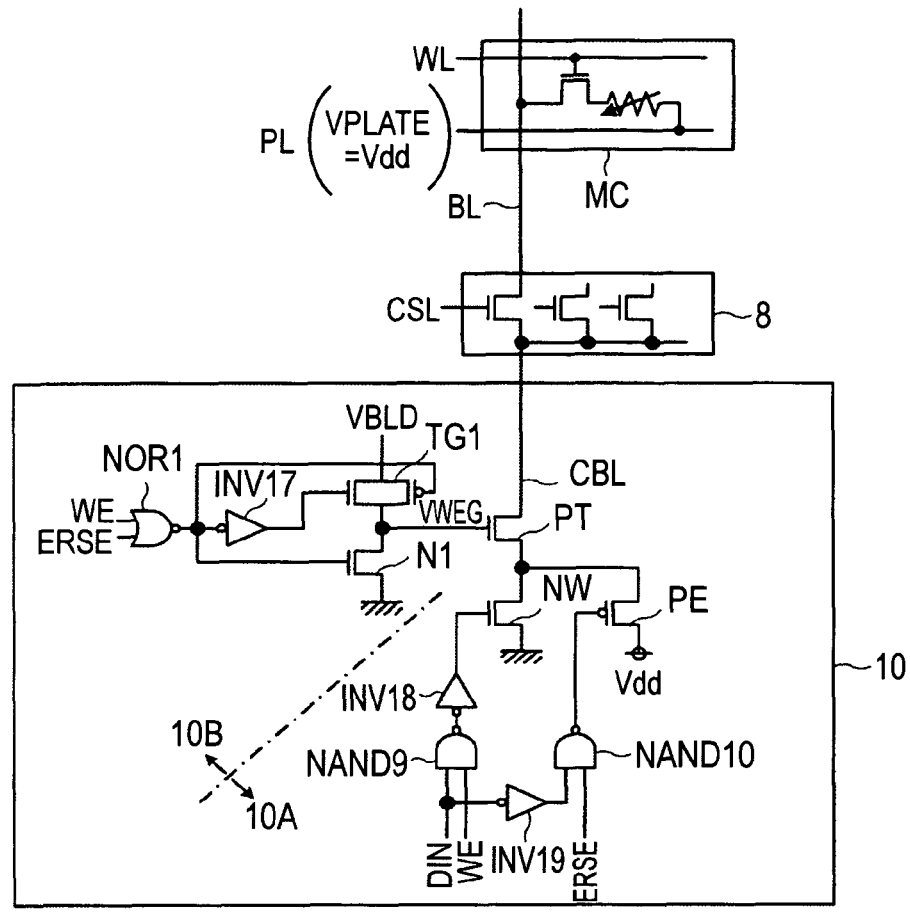
FIG. 24 is a circuit diagram including the configuration of a write and erase driver corresponding to the first embodiment.

The configuration of the write and erase driver 10 corresponding to the first embodiment is shown in FIG. 24.

To correspond to the first embodiment, the common line pass transistor PT has an NMOS configuration and the source thereof is grounded. The plate voltage VPLATE of the plate line PL is maintained at the positive power supply voltage, for example, Vdd.

The write and erase driver 10 roughly includes the BL driver 10A and a VBLD-connection control unit 10B.

The VBLD-connection control unit 10B is a circuit that connects the driving gate voltage VELD to the gate of the common line pass transistor PT only during the write and the erase and makes the bit line BL float otherwise, for example, during the readout.

Specifically, the VBLD-connection control unit 10B includes one each of a NOR circuit NOR1, an inverter INV17, a transfer gate circuit TG1, and an NMOS transistor N1.

The transfer gate circuit TG1 and the NMOS transistor N1 are serially connected between an input node of the driving gate voltage VELD and the ground potential. A connection midpoint of the transfer gate circuit TG1 and the NMOS transistor N1 is connected to the gate of the common line pass transistor PT. The gate voltage of the common line pass transistor PT is hereinafter referred to as "control MOS gate voltage VWEG".

The write enable signal WE and the erase enable signal ERSE are input to the two-input NOR circuit NOR1 from the control circuit 11 shown in FIG. 13. An output of the NOR circuit NOR1 is connected to a PMOS side of the transfer gate circuit TG1 and input to an NMOS side of the transfer gate circuit TG1 and the gate of the NMOS transistor N1 via the inverter INV17.

In the VBLD-connection control unit 10B having such a configuration, the write enable signal WE or the erase enable signal ERSE changes to "H". Then, since the control MOS gate voltage VWEG is connected to the driving gate voltage VELD, BL driving by the common line pass transistor PT is activated.

On the other hand, except during the write and during the erase, the control MOS gate voltage VWEG is connected to the reference voltage Vss by the NMOS transistor N1 in the ON state. The common line pass transistor PT is turned off and allows the bit line BL to float.

The BL driver 10A is a circuit that performs control for switching the source of the common line pass transistor PT between the high level and the low level according to the application of a write pulse and an erase pulse. Concerning this switching control, FIGS. 5 and 6 can be referred to.

The BL driver 10A includes an NMOS transistor NW between the source of the common line pass transistor PT and the ground potential (the low level) and includes a PMOS transistor PE between the source of the common line pass transistor PT and the power supply voltage Vdd (the high level).

The BL driver 10A includes a circuit that differentially controls a pair of these two transistors. The circuit includes two inverters INV18 and INV19 and two NAND circuits NAND9 and NAND 10.

Input data DIN and the write enable signal WE are input to the two-input NAND circuit NAND9. The output of the NAND circuit NAND 9 controls a gate of the NMOS transistor NW via the inverter INV18. Therefore, the NMOS transistor NW is turned on when a logic of the input data DIN is "H" in an active period in which the write enable signal WE is "H". When the NMOS transistor NW is turned ON, the ground voltage is transmitted to the common bit line CBL via the common line pass transistor PT.

On the other hand, the input data DIN is input to one input of the two-input NAND circuit NAND1 and the erase enable signal ERSE is input to the other input. An output of the NAND circuit NAND10 is connected to a gate of the PMOS transistor PE. Therefore, the PMOS transistor PE is turned on when the logic of the input data DIN is "L" in an active period in which the erase enable signal ERSE is "H". When the PMOS transistor PE is turned on, the power supply voltage Vdd is transmitted to the common bit line CBL via the common line pass transistor PT in the ON state.

Although not specifically shown in the figure, the input data DIN is input to the write and erase driver 10 shown in FIG. 24 after NAND of the input data DIN and a driving enable signal DRVE output from the control circuit 11 shown in FIG. 13 is calculated (logic control by a series circuit of a NAND and an INV).

When a correspondence relation between the logic of the input data DIN and the logic of the write and the erase is different, i.e., when "DIN=L" is the write and "DIN=H" is the erase, a connection position of the inverter INV19 can be changed according to the difference.

In a period in which the NMOS transistor NW connects the common bit line CBL to the ground voltage, the gate bias of the common line pass transistor PT is controlled by the driving gate voltage VBLD and the level of the cell current Icell at that point is limited. This holds true in a period in which the PMOS transistor PE connects the common bit line CBL to the power supply voltage Vdd.

PL Driver Configuration

Figure 25:
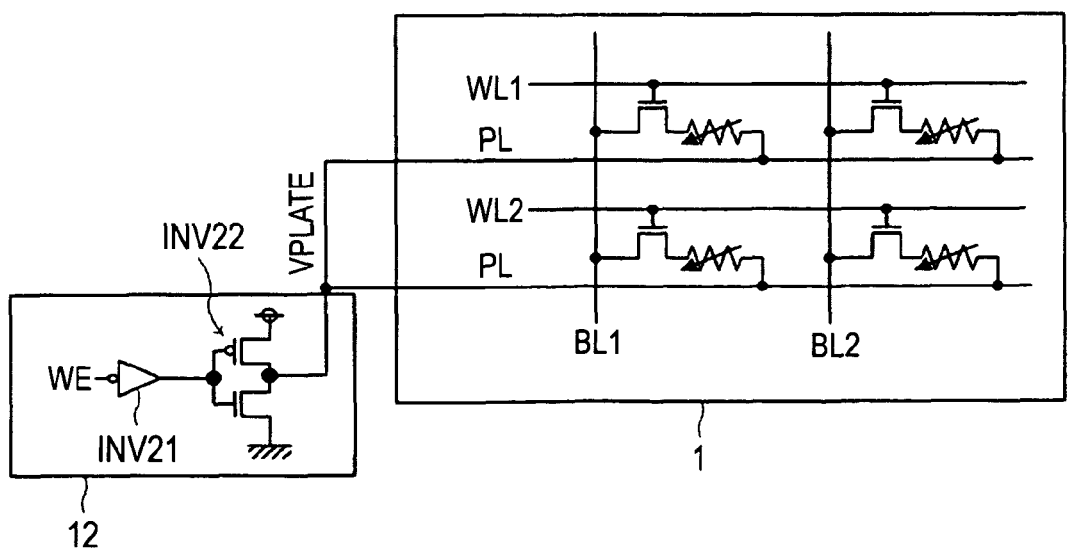
FIG. 25 is a circuit diagram including the configuration of a plate driver.

A configuration example of the plate driver 12 is shown in FIG. 25. In the example shown in FIG. 25, the plate driver 12 causes the plate lines PL to operate at "VPLATE=Vdd" during the write and at "VPLATE=Vss" during the erase and during the readout.

The plate driver 12 illustrated in FIG. 25 includes inverters INV21 and INV22 in two stages. In FIG. 25, a detailed circuit configuration of only the inverter 22 in the post stage is shown.

This circuit pulls up all the plate lines PL to the power supply voltage Vdd at "VPLATE=Vdd" when the write enable signal WE is "H". The circuit pulls down all the plate lines PL to "VPLATE=Vss" when the write enable signal WE is "L", i.e., during the erase and during the readout.

Write Operation

In an operation method according to the first embodiment, a write operation example is explained with reference to FIGS. 26 and 27.

Figure 26:
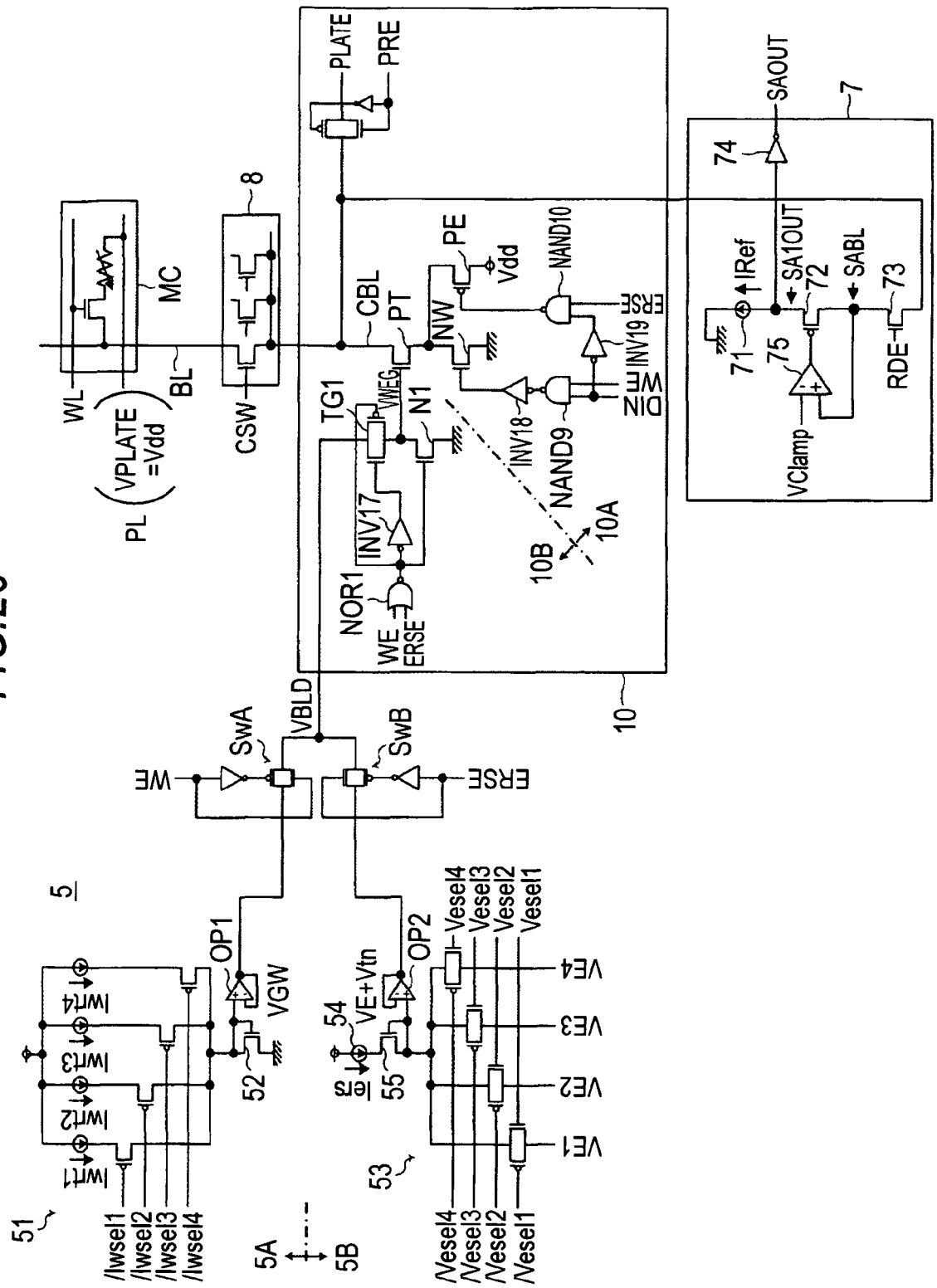
FIG. 26 is a circuit diagram used for explanation of write operation.
Figure 27:
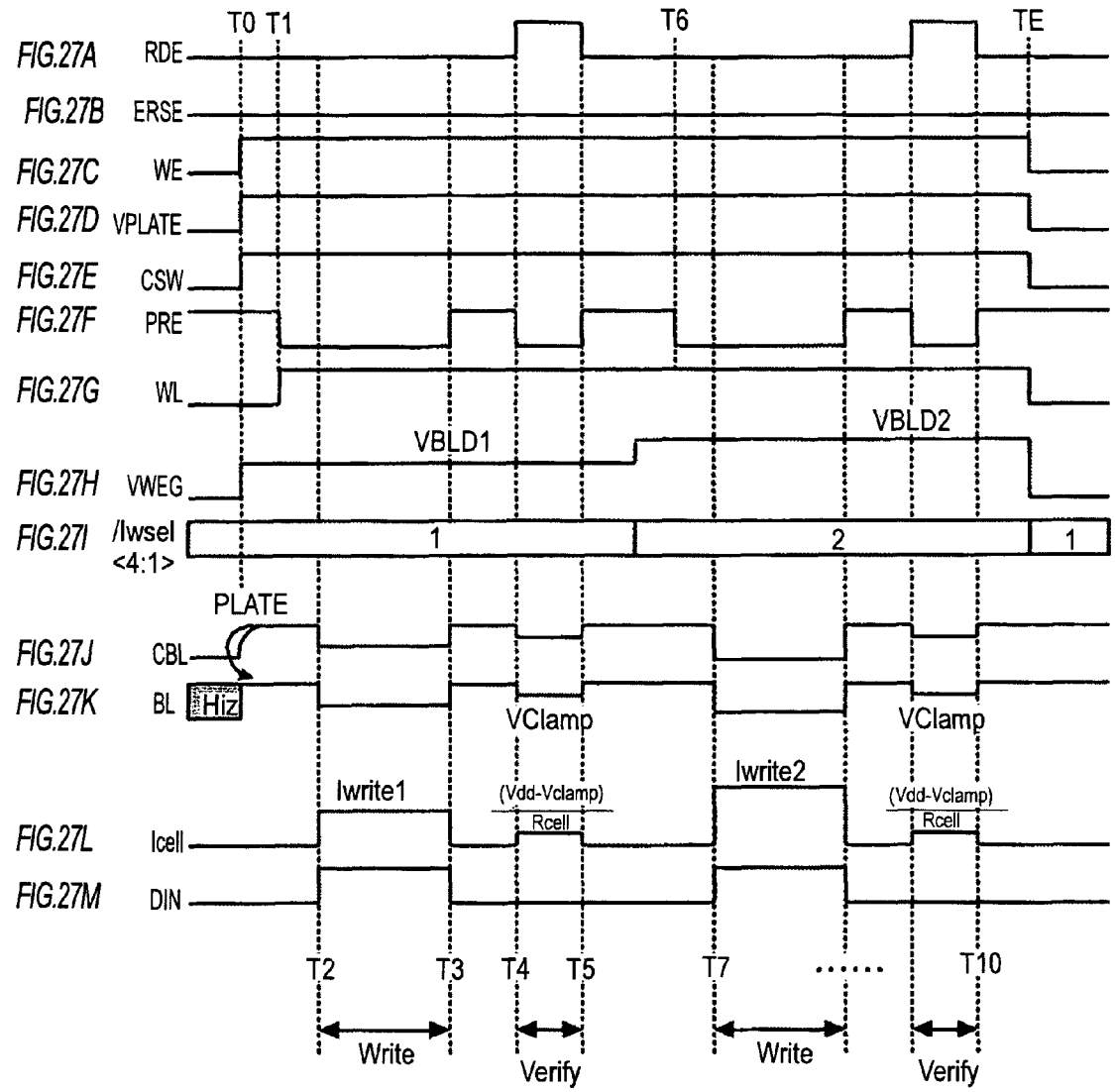
FIGS. 27A to 27M are timing charts of the write operation.

FIG. 26 is a diagram in which the circuits shown in FIGS. 19, 20, and 24 are connected. FIGS. 27A to 27M are write operation waveform charts (timing chart).

A readout enable signal RDE shown in FIG. 27A is given to a gate of an NMOS transistor 73 shown in FIGS. 19 and 26. The NMOS transistor 73 is turned on only when the readout enable signal RDE is active ("H").

A pre-charge signal PRE shown in FIG. 27J is a signal for activating a pre-charge circuit not specifically shown in FIG. 13. An active level of the pre-chare signal PRE is "H".

Other signals, voltages, and electric currents in FIGS. 27A to 27M are already explained.

In a period before time T0 shown in FIGS. 27A to 27M, all selection signals (WLEN and YSWEN) in the word line WL, the column selection line CSW, and the like are at the reference voltage Vss level and are inactive (see FIG. 13).

Since the write enable signal WE is "L", the plate voltage VPLATE is "VPLATE=Vss" in the circuit shown in FIG. 25 (FIG. 27D).

Since the pre-charge signal PRE is "H", the potential of the common bit line CBL is also "VPLATE=Vss" (FIG. 27J).

Since the write enable signal WE is "L", the gate voltage of the common line pass transistor PT (the control MOS gate voltage VWEG) is inactive at the Vss level (FIG. 27H).

At time T0, for the write, the write enable signal WE changes to "H" (FIG. 27C).

Then, the plate voltage VPLATE is pulled up to the power supply voltage Vdd (FIGS. 27D and 27J).

At the same time, the column selection line CSW is opened (FIG. 27E). Since the pre-charge signal PRE is at the active level at this point, the potential of the bit line BL is pre-charged to the plate voltage VPLATE through the common bit line CBL.

The pre-charge is performed to prevent malfunction (disturb) caused by unintended potential fluctuation of the bit line BL because a transient current flows when the word line WL is opened later.

When "WE=H" at time T0, the driving gate voltage VBLD is connected to the write control voltage VGW according to the operation of the VBLD-connection control unit 10B shown in FIG. 26. The write control voltage VGW depends on any one of the write reference currents Iwrt1 to Iwrt4 selected by the reference-current generating unit 51.

In FIGS. 27A to 27M, the write operation starts in a state in which the write reference current Iwrt1 is selected (represented as "1" in FIG. 27I). A value of the driving gate voltage VBLD at this point is represented by reference sign "VBLD1" in FIG. 27H. In FIG. 27H, the control MOS gate voltage VWEG changes to a "VBLD1" level higher than the reference voltage Vss at time T0. Since the potential of the word line WL is the ground potential (=0V) at this point (FIG. 27G), the cell current Icell does not flow (FIG. 27L). Since the input data DIN is inactivated (=0V) at this point (FIG. 27M), readout is not performed either.

At time T1, the pre-charge signal PRE is transitioned to "L" to turn off the pre-charge (FIG. 27F). Consequently, the potentials of the bit line BL and the common bit line CBL float.

At time T1, substantially at the same time, the potential of the word line WL is raised (FIG. 27G). Since the write is not started at this point, the potential of the bit line BL precharged to the plate voltage VPLATE does not change from the floating (FIGS. 27D and 27K). Therefore, the cell current Icell does not flow (FIG. 27L).

Since the input data DIN is at "L" (=0V), even if data is input to the bit line BL, the cell current Icell does not flow.

At time T2, the input data DIN is activated to "H" (FIG. 27M). Then, in the BL driver 10A shown in FIG. 26, since the NMOS transistor NW is turned on, a current path is formed and the cell current Icell (the write current Iw) corresponding to variable cell resistance Rcell flows to the memory cell MC (FIG. 27L). A cell current value at this point is limited to a value corresponding to the level (VBLD1) of the control MOS gate voltage VWEG. In FIG. 27L, this value is represented by reference sign "Iwrite1".

At time T3, when the input data DIN is changed to "L", the application of the write current Iw ends.

At time T3, the pre-charge signal PRE is activated to execute the pre-charge operation again (FIG. 27F). Therefore, the potentials of the bit line BL and the common bit line CBL transition to a level equivalent to the plate voltage VPLATE at the high level (FIGS. 27J and 27K).

Subsequently, at time T4, the pre-charge is ended and the readout enable signal RDE is activated to "H". Consequently, the NMOS transistor 73 shown in FIG. 26 is turned on and verify readout is started. At this point, the bit line BL potential is limited to the clamp voltage VClamp according to the actions of the NMOS transistor 72 and the operational amplifier 75 shown in FIG. 26. The clamp voltage VClamp is set in advance to a value for limiting stress applied to the memory cell MC to current stress weak enough for not causing write and erase disturb.

At this point, a cell current is limited to "(Vdd-VClamp)/Rcell" as shown in FIG. 27L as well.

The limited cell current is converted into the sense node potential SA1OUT shown in FIG. 26. This potential is amplified by the sense unit 74 and readout. At time T5, when the readout enable signal RDE is reset to inactive (FIG. 27A), first verify readout operation is completed.

In FIGS. 27A to 27M, the direction of electric current during the verify readout is set the same as the write direction in the memory cell (a direction of an arrow included in a circuit sign of the variable cell resistor Rcell).

On the other hand, verify readout for lowering the plate voltage VPLATE to "L" and feeding electric current in an erase direction (a direction opposite to the arrow included in the circuit sign) is also possible.

In this case, in FIG. 26, it is possible to cope with the verify readout in terms of a circuit configuration by replacing the configuration of the sense amplifier 7 corresponding to FIG. 19 with the configuration shown in FIG. 18.

Determination of success (fail or success) of the verify readout based on the SA output signal SAOUT can be realized as a function in a CPU in an IC or the write and erase driver 10.

When an additional write pulse is applied in response to a result of the determination, the pulse is applied again. Operation in that case is explained below.

When the verify readout fails, the next additional write pulse current is intensified and the write operation and the verify readout operation are executed again.

At time T5 to T10 in FIGS. 27A to 27M, basically, the operation at time T0 to T5 is repeated. However, at a point before the pre-charge ends at time T6, the selection signals /Iwsel1 to /Iwsel4 are switched to the active state of /Iwsel2. Then, the write control voltage VGW potential changes and, as shown in FIG. 27H, a value of the control MOS gate voltage VWEG transitions from "VBLD1" to larger "VBLD2".

Therefore, in second write operation starting from time T7, a value of the cell current Icell (the write current Iw) is switched from "Iwrite1" to larger "Iwrite2".

As a result, write is executed by a large write pulse current and, thereafter, the verify operation is executed in the same manner as the first time.

Operation performed when the verify readout is successful is explained.

When the verify readout is successful, the write enable signal WE changes to "L" according to the control of a not-shown determining circuit (time TE in FIGS. 27A to 27M). Consequently, the plate voltage VPLATE also drops to "L". At the same time, the potentials of the word line WL and the column selection line CSW fall. The pre-charge signal PRE is at the active level "H". Therefore, the common bit line CBL is pre-charged. The control MOS gate voltage VWEG is inactivated at the Vss level according to "WE=L".

The operation explained above is repeated a necessary number of times in order to control the number of times of application of the write pulse and a peak value of the pulse according to a result of the verify readout.

Erase Operation

An example of the erase operation in the operation method according to the first embodiment is explained below with reference to FIGS. 28 and 29.

Figure 28:
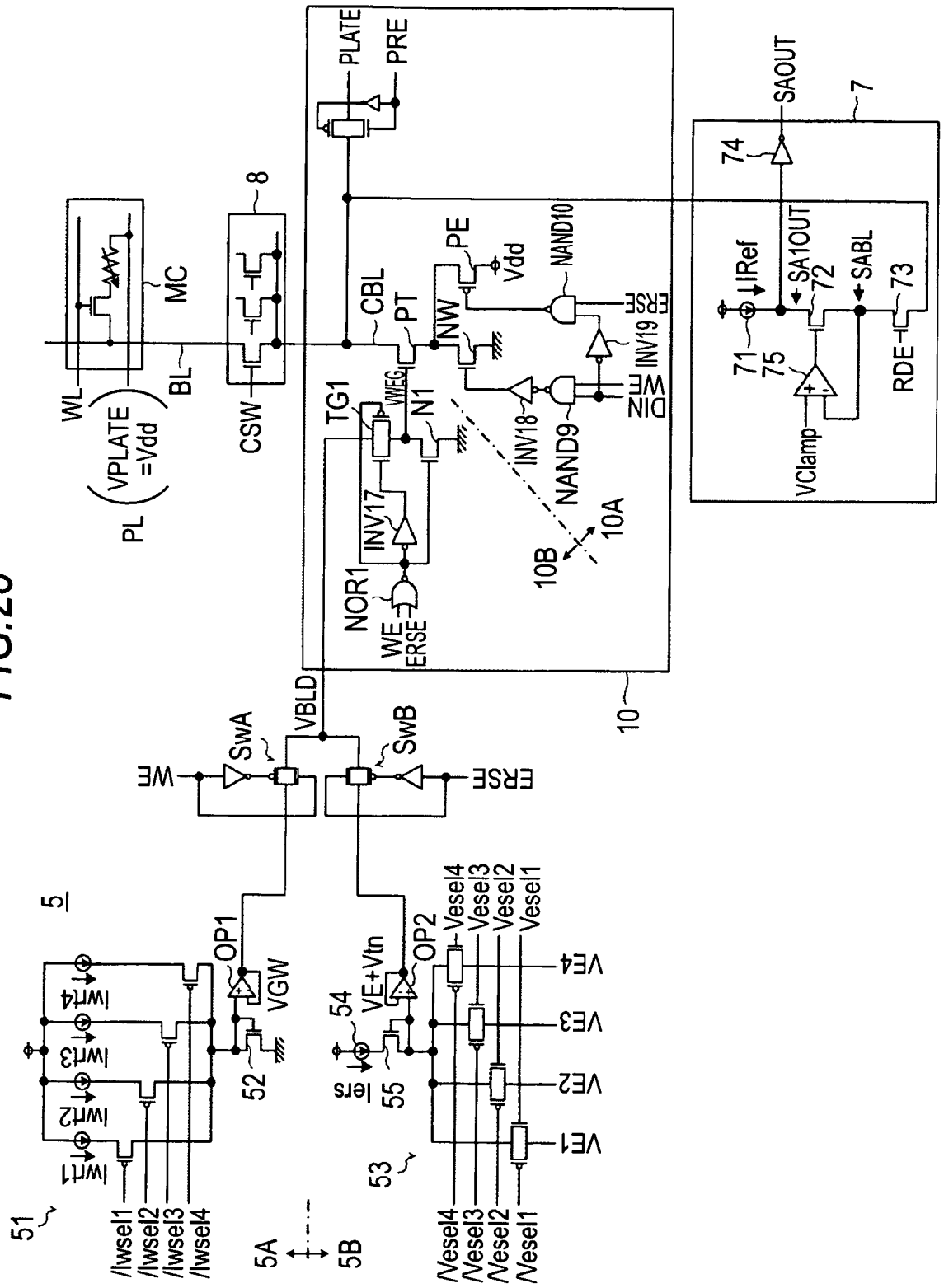
FIG. 28 is a circuit diagram used for explanation of erase operation.
Figure 29:
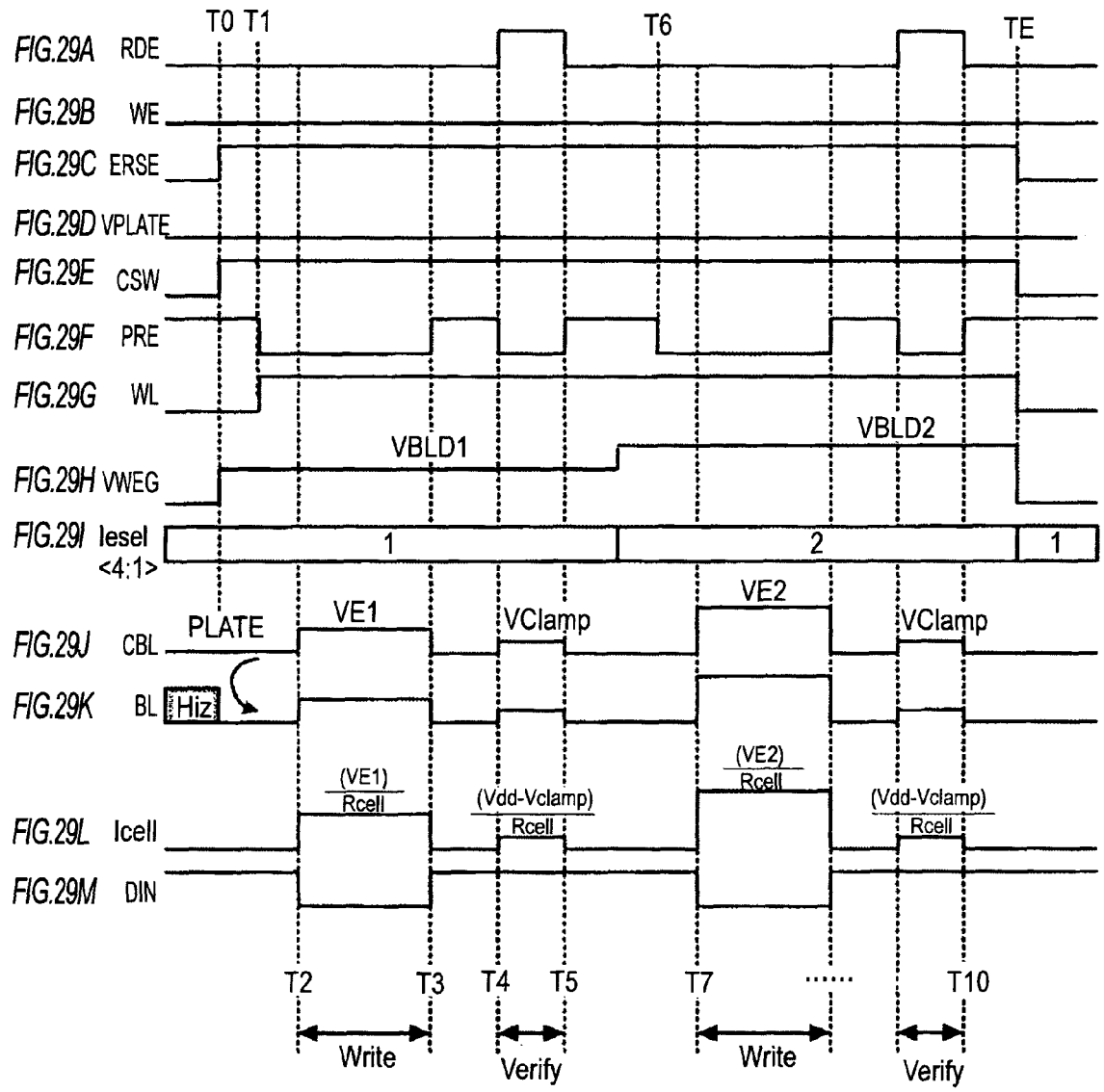
FIGS. 29A to 29M are timing charts of the erase operation.

FIG. 28 is a diagram in which the circuits shown in FIGS. 18, 20, and 24 are connected. FIGS. 29A to 29M are erase operation waveform charts (timing chart).

In FIGS. 29A to 29M, signals, voltages, electric currents same as those shown in FIGS. 27A to 27M are denoted by the same reference signs and redundant explanation thereof is omitted.

In a period before time T0 shown in FIGS. 29A to 29M, all selection signals (WLEN and YSWEN) of the word line WL, the column selection line CSW, and the like are inactive at the reference voltage Vss level (see FIG. 13).

Since the write enable signal WE is "L", the plate voltage VPLATE is "VPLATE=Vss" in the circuit shown in FIG. 25 (FIG. 29D).

Since the pre-charge signal PRE is "H", the potential of the common bit line CBL is also "VPLATE=Vss" (FIG. 29J).

Since the write enable signal WE is "L", the gate voltage of the common line pass transistor PT (the control MOS gate voltage VWEG) is inactive at the Vss level (FIG. 29H).

At time T0, for the erase, the erase enable signal ERSE changes to "H" (FIG. 29C).

Since the write enable signal WE is "L" at this point, the plate voltage VPLATE maintains the reference voltage Vss (FIGS. 29D and 29J).

At the same time, the column selection line CSW is opened (FIG. 29E). Since the pre-charge signal PRE is at the active level at this point, the potential of the bit line BL is fixed to the potential of the low level of the plate voltage VPLATE through the common bit line CBL.

The pre-charge (fixing to the low level) explained above is performed to prevent malfunction (disturb) caused by unintended potential fluctuation of the bit line BL because a transient current flows when the word line WL is opened later.

When "ERSE=H" at time T0, the driving gate voltage VELD is connected to the erase control voltage (VE+Vtn) according to the operation of the VBLD-connection control unit 10B shown in FIG. 28. As the erase reference voltage VE, any one of the erase reference voltages VE1 to VE4 selected by the reference-voltage generating unit 53 is selected.

In FIGS. 29A to 29M, the erase operation starts in a state in which the erase reference voltage VE1 is selected (represented as "1" in FIG. 29I). A value of the driving gate voltage VBLD at this point is represented by reference sign "VBLD1" in FIG. 29H. In FIG. 29H, the control MOS gate voltage VWEG changes to a "VBLD1" level higher than the reference voltage Vss at time T0. Since the potential of the word line WL is the ground potential (=0V) at this point (FIG. 29G), the cell current Icell does not flow (FIG. 29L). Since the input data DIN is inactivated (=Vdd) at this point (FIG. 29M), readout is not performed either.

At time T1, the pre-charge signal PRE is transitioned to "L" to turn off the pre-charge (FIG. 29F). Consequently, the potentials of the bit line BL and the common bit line CBL float.

At time T1, substantially at the same time, the potential of the word line WL is raised (FIG. 29G). Since the erase is not started at this point, the potential of the bit line BL pre-charged to the plate voltage VPLATE does not change from the floating "L" state (FIGS. 29D and 29K). Therefore, the cell current Icell does not flow (FIG. 29L).

Since the input data DIN is at "H" (=Vdd), even if data is input to the bit line BL, the cell current Icell does not flow.

At time T2, the input data DIN is activated to "L" (FIG. 29M). Then, in the BL driver 10A shown in FIG. 28, since the PMOS transistor PE is turned on, a current path is formed and the cell current Icell (the erase current Ie) corresponding to the variable cell resistance Rcell flows to the memory cell MC (FIG. 29L). A voltage value actually applied to the bit line BL at this point is limited to a value corresponding to the level (VBLD1) of the control MOS gate voltage VWEG. In FIG. 29L, this value is represented by reference sign "VE1".

At time T3, when the input data DIN is changed to "H", the application of the erase reference voltage VE ends.

At time T3, the pre-charge signal PRE is activated to execute the pre-charge operation again (FIG. 29F). Therefore, the potentials of the bit line BL and the common bit line CBL transition to a level equivalent to the plate voltage VPLATE at the high level (FIGS. 29J and 29K).

Subsequently, at time T4, the pre-charge is ended and the readout enable signal RDE is activated to "H". Consequently, the NMOS transistor 73 shown in FIG. 28 is turned on and verify readout is started. At this point, the bit line BL potential is limited to the clamp voltage VClamp according to the actions of the NMOS transistor 72 and the operational amplifier 75 shown in FIG. 28. The clamp voltage VClamp is set in advance to a value for limiting stress applied to the memory cell MC to current stress weak enough for not causing write and erase disturb.

At this point, a cell current is limited to "(Vdd-VClamp)/Rcell" as shown in FIG. 29L as well.

The limited cell current is converted into the sense node potential SA1OUT shown in FIG. 28. This potential is amplified by the sense unit 74 and read out. At time T5, when the readout enable signal RIDE is reset to inactive (FIG. 29A), first verify readout operation is completed.

In FIGS. 29A and 29M, the direction of electric current during the verify readout is set the same as the erase direction in the memory cell.

On the other hand, verify readout for raising the plate voltage VPLATE to "H" and feeding electric current in the write direction is also possible.

In this case, in FIG. 28, it is possible to cope with the verify readout in terms of a circuit configuration by replacing the configuration of the sense amplifier 7 corresponding to FIG. 18 with the configuration shown in FIG. 19.

Determination of success (fail or success) of the verify readout based on the SA output signal SAOUT can be realized as a function in a CPU in an IC or the write and erase driver 10.

When an additional erase pulse is applied in response to a result of the determination, the pulse is applied again. Operation in that case is explained below.

When the verify readout fails, the next additional erase pulse current is intensified and the write operation and the verify readout operation are executed again.

At time T5 to T10 in FIGS. 29A to 29M, basically, the operation at time T0 to T5 is repeated. However, at a point before the pre-charge ends at time T6, the selection signals Iesel1 to Iesel4 are switched to the active state of Iesel2. Then, the erase reference voltage VE changes and, as shown in FIG. 29H, a value of the control MOS gate voltage VWEG transitions from "VBLD1" to larger "VBLD2".

Therefore, in second erase operation starting from time T7, a value of the potential of the bit line BL (the common it line CBL) for feeding the cell current Icell (the erase current Ie) is switched from "VE1" to larger "VE2".

As a result, erase is executed by a large erase pulse current and, thereafter, the verify operation is executed in the same manner as the first time.

Operation performed when the verify readout is successful is explained.

When the verify readout is successful, the erase enable signal ERSE changes to "L" according to the control of the not-shown determining circuit (time TE in FIGS. 29A to 29M). Consequently, the potentials of the word line WL and the column selection line CSW fall. The pre-charge signal PRE is at the active level "H". Therefore, the common bit line CBL is pre-charged to "L" (more accurately, discharged). The control MOS gate voltage VWEG is inactivated at the Vss level according to "ERSE=L".

The operation explained above is repeated a necessary number of times in order to control the number of times of application of the erase pulse and a peak value of the pulse according to a result of the verify readout.

Various modifications of the first to fifth embodiments are possible.

6. First Modification

A first modification relates to BL driver arrangement. The first modification can be applied to all of the first to fifth embodiments. As an example, application of the first modification to the first embodiment is explained.

FIG. 30 is a diagram of BL driver arrangement according to the first modification. An example in which the VELD driver 5 is shared by upper and lower memory cell blocks (memory sub-arrays MSA) is shown in FIG. 30. The configuration of the VBLD driver 5 itself is the same as that shown in FIGS. 5 and 6 according to the first embodiment.

The output of the VELD driver 5 is input to the VBLD-connection control unit 10B corresponding to an upper memory sub-array MSA1 and input to the other VBLD-connection control unit 10B corresponding to a lower memory sub-array MSA2. The BL driver 10A is connected to each of the bit lines BL.

The configuration of the BL driver 10A and the VBLD-connection control unit 10B may be a simple configuration as shown in FIG. 30. However, the BL driver 10A and the VBLD-connection control unit 10B may be controlled according to various control signals as shown in FIG. 24 and the like.

When the different two memory sub-arrays MSA perform independent verify readout determination, the write and erase driver 10 may not be able to simultaneously output different driving gate voltages VBLD.

In that case, it is advisable to select the upper and lower memory sub-arrays MSA1 and MSA2 according to selection signals /BLIDE and /BLIUE. In this case, the common line pass transistor PT can operate to carry out a part of the function (sub-array selection) of the column switch 8 shown in FIG. 13 and execute control of the levels of applied current and voltage to the memory cell MC based on the driving gate voltage VBLD voltage.

The common line pass transistor PT can be used together with the column switch 8 not only in the first modification but also in the first to fifth embodiments and second and third modifications.

7. Second Modification

In a second modification, another example of the arrangement of the VBLD driver 5 is explained. The second modification can be applied to all of the first to fifth embodiment.

BL driver arrangement according to the second modification is shown in FIG. 31.

The memory cell array 1 (FIG. 7) is divided into the memory sub-arrays MSA. In this example, the memory cell array 1 is divided into sixteen (4×4) memory sub-arrays MSA.

Between two memory sub-arrays MSA adjacent to each other in a column direction (an up to down direction in FIG. 31), arrays (SA lines 7L) of the sense amplifiers 7 (represented as S.A) and lines (BLDR lines 10AL) of the BL drivers 10A (see, for example, FIG. 24) are arranged in parallel in two stages. The VBLD driver 5 and the VBLD-connection control unit 10B (see, for example, FIG. 24) are arranged for each pair of the SA line 7L and the BLDR line 10AL. A set of pairs of VBLD drivers 5 and VBLD-connection control units 10B is arranged along one of sides in the column direction of the memory cell array 1 as a VBLDR column 5C.

In this driver arrangement, it is possible to disperse driving gate voltage VBLD load by dispersedly arranging BL drivers and perform high-speed operation. It is possible to improve the layout density of the memory cell array 1 by arranging the VBLD drivers and the like on the outside of the memory cell array 1. The improvement of the layout density of the memory cell array 1 contributes to a reduction in wiring load. Therefore, further improvement of operation speed can be expected.

EFFECTS OF THE APPLICATION OF THE INVENTION

Effects of the first to fifth embodiments and the first and second modifications are explained below in comparison with a comparative example.

Figure 32:
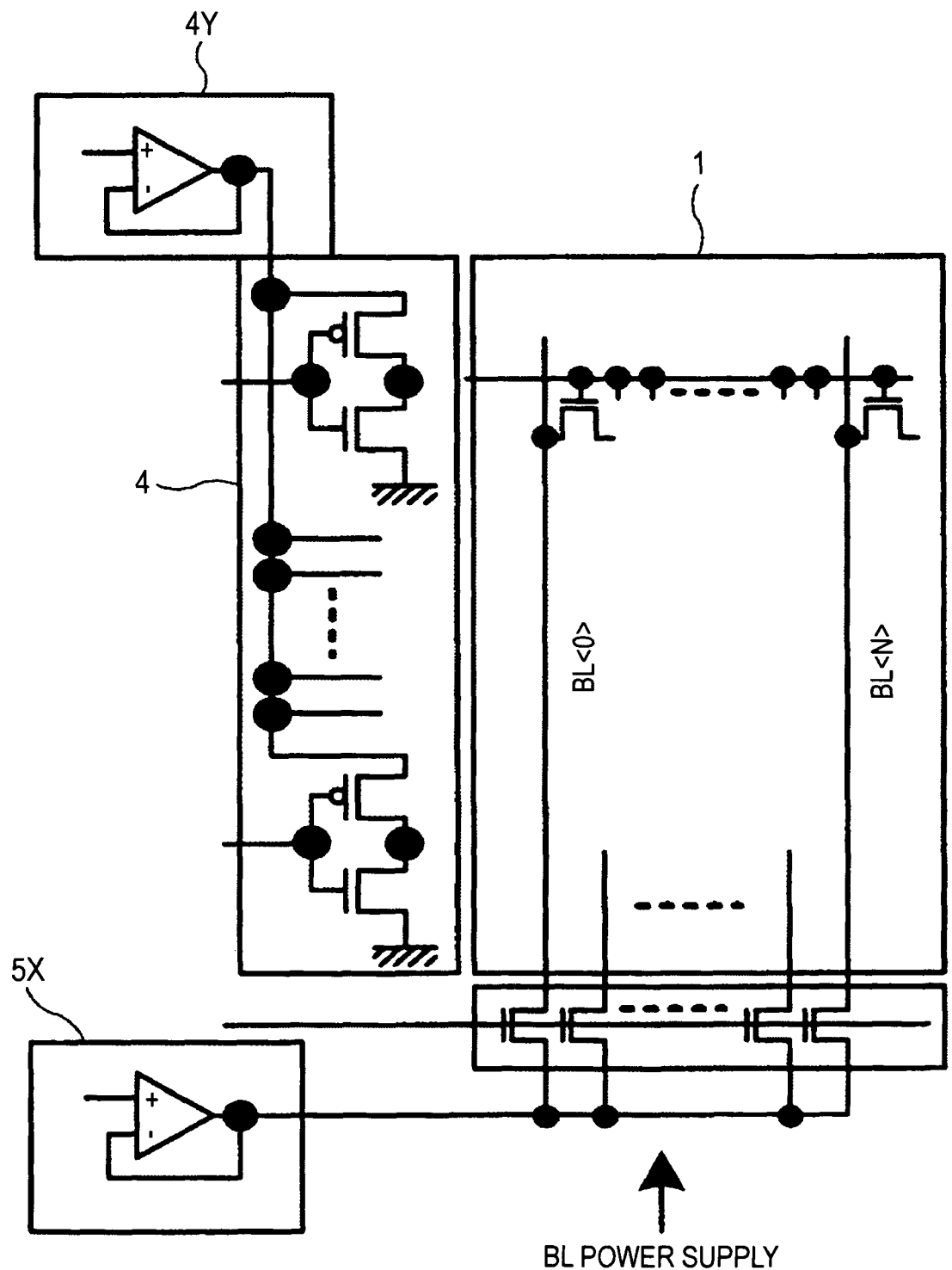
FIG. 32 is a diagram for explaining a comparative example.
Figure 33:
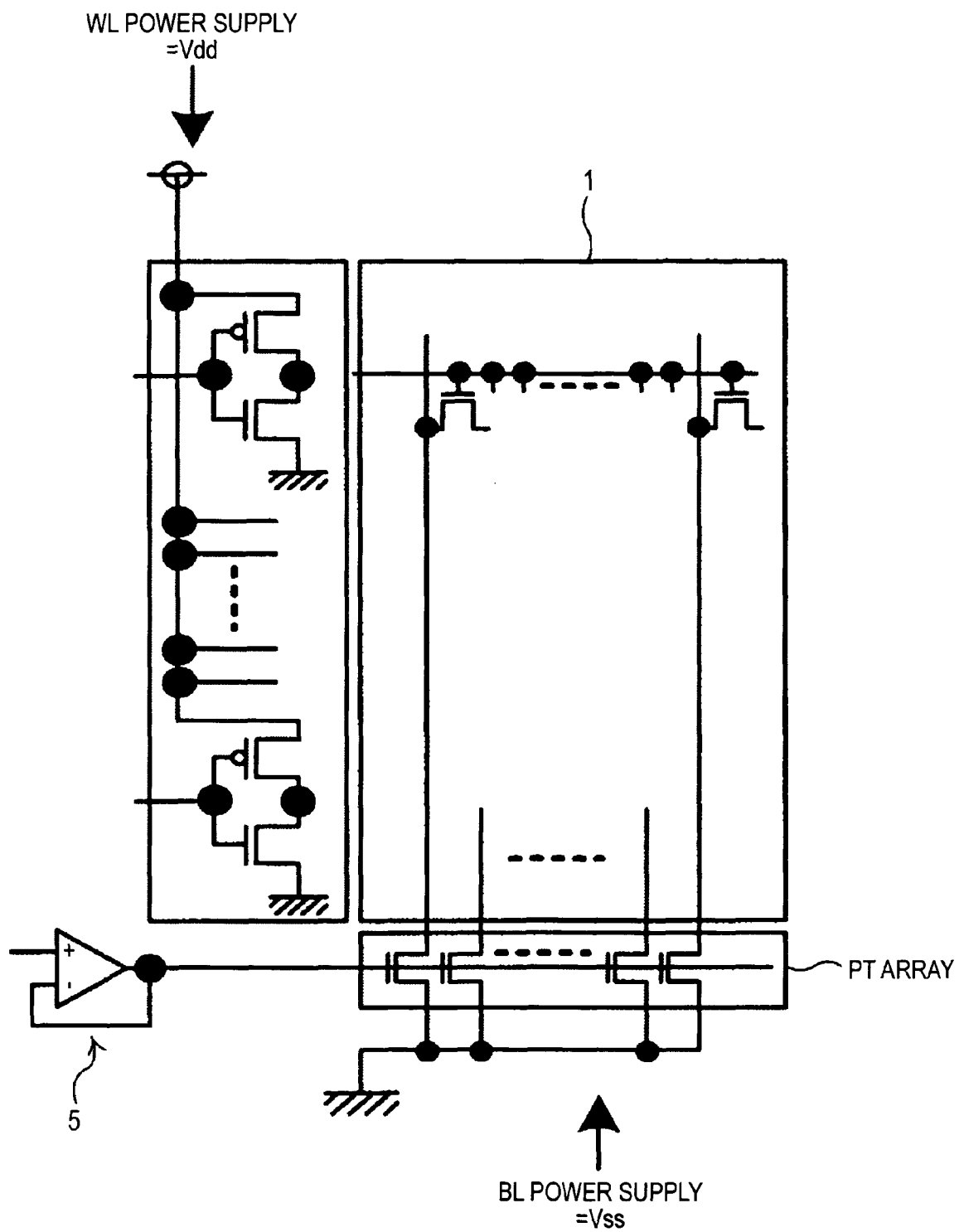
FIG. 33 is a diagram for explaining effects by the application of the present invention.

FIG. 32 is a diagram for explaining a comparative example. FIG. 33 is a diagram for explaining an example to which the present invention is applied.

In FIG. 32, reference sign 5X represents a driver that controls the power supply voltage itself of the bit line BL of the memory cell MC. This driver is referred to as BL power supply driver 5X. The BL power supply driver 5X is a driver that directly charges and discharges the bit line BL at power supply voltage amplitude. It should be noted that, in this regard, the BL power supply driver 5X is different from the VELD driver 5 according to the embodiments that controls MOS gate voltage.

In the example shown in FIG. 32, all the bit lines BL and a BL power supply line are connected. However, actually, a predetermined number of bit lines BL are driven as a unit. All the bit lines BL may be simultaneously driven.

In any case, it is necessary to control the potential of the bit lines BL including junction capacitance of bit line load for a selected bit line BL and switch MOS transistors of unselected bit lines BL. The load of the bit lines BL themselves is large and, moreover, when the number of bit lines actuated in parallel to realize a high transfer rate, a delay (standby time for logic change) in varying the potential of the BL power supply line increases. As a result, it is difficult to realize high-speed operation.

The configuration shown in FIG. 32 also includes a configuration for controlling the power supply voltage of the word lines WL separately from or redundantly with BL power supply driving. In other words, FIG. 32 is a comprehensive diagram including the application of only BL power supply driving, the application of only WL power supply driving, and the application of both the BL power supply driving and the WL power supply driving.

In this configuration, a WL power supply driver 4Y that finely controls the power supply voltage of the WL driver 4 is provided. A value of rewriting applied current can be controlled according to the control by the WL power supply driver 4Y. In that case, it is necessary to control word line potential including junction capacitance of the load of the word line WL selected by a row decoder and switch MOS transistors of unselected word lines WL. The load of the word lines WL themselves is large and, moreover, a delay (standby time for logic decision) in varying the potential of a WL power supply line increases. As a result, it is difficult to realize high-speed operation.

As opposed to the comparative example explained above, in the embodiments and the modifications, the common line pass transistor PT is provided for each of the bit lines BL and the VBLD driver 5 controls the gate voltage of the common line pass transistor PT.

In this control, fixed power supply lines for the reference voltage Vss, the power supply voltage Vdd, and the like are used as a BL power supply and a WL power supply having large load. Low-impedance internal wires in the VBLD driver 5 are voltage-controlled or current-controlled. The gate voltage of the common line pass transistor PT is controlled via a driver driven by the power supply voltage Vdd. The gate load of the common line pass transistor PT is negligibly small compared with the load of the bit lines BL and the word lines WL. Even in a case like the second modification 2 (FIG. 31) in which a large number of common line pass transistors PT are simultaneously driven, gates of the common line pass transistors PT are driven by the output of the drivers (the operational amplifiers OP1 and OP2). Therefore, even in the case like the second modification (FIG. 31), a driver ability can be adjusted according to the number of common line pass transistors PT that should be simultaneously controlled.

Therefore, high-speed operation is possible even if a large number of common line pass transistors PT same in number as, for example, the number of memory cells in the row direction of the memory cell array 1 are simultaneously driven.

A modification of WL driving is also explained below.

8. Third Modification

It is also possible to adopt a configuration for boosting the WL power supply voltage to be equal to or higher than the power supply voltage Vdd for the purpose of reducing the ON resistance of the access transistor AT in order to gain electric current during the write and during the erase.

It is also possible to adopt a configuration for stepping down the WL power supply voltage to be lower than the reference voltage Vss (e.g., the ground voltage) in order to reduce errors due to leak of unselected memory cells during cell current readout.

A diagram of the WL driver unit 4A that can be replaced with the configuration shown in FIG. 16 is shown in FIG. 34.

The WL driver unit 4A shown in FIG. 34 includes a first boosting unit 4B that can convert the power supply voltage having the amplitude of the power supply voltages Vdd to Vss into first boosted power supply voltage having the amplitude Vpp (>Vdd) to Vss. The WL driver unit 4A includes a second boosting unit 4C that can convert the boosted power supply voltage in the first stage into second boosted power supply voltage having larger amplitude VPP to VNWL (<Vss).

It is also possible to select whether the power supply voltages VPP to Vss should be output through only the second boosting unit 4C or the original power supply voltages of the Vdd to Vss should be output through both the first boosting unit 4B and the second boosting unit 4C. The selection can be controlled according to whether inverters INV30 and INV31 for outputting power supply voltages through the boosting units provided in the respective stages are activated.

For the purpose of supporting the bit line BL driving by the VBLD driver 5, the WL driver unit 4A having a configuration shown in FIG. 34 is also useful. Specifically, although the WL driver unit 4A shown in FIG. 34 directly drives the word lines WL with large load, it is also possible to reduce the load to the level of power supply voltages in a control step thereof and use the driving together with the driving of the driving gate voltage VBLD by the VELD driver 5.

The present application contains subject matter related to that disclosed in Japanese Priority Patent Application JP 2009-012385 filed in the Japan Patent Office on Jan. 22, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A variable resistance memory device comprising:
a first common line;
a second common line;
plural memory cells each formed by serially connecting a memory element, resistance of which changes according to applied voltage, and an access transistor between the second common line and the first common line; and
a driving circuit that drives the plural memory cells through the first common line and the second common line, wherein
the driving circuit has:
a common line pass transistor of an N type connected between the first common line and a supply node that is supplied with a predetermined voltage;
a gate driver circuit for the common line pass transistor that current-drives the first common line when the memory element of the memory cell is changed from one side of a low resistance state and a high resistance state into the other side, and voltage-drives the first common line when a state of the memory element is reversely changed from the other side into the one side of the resistance states; and
a driving voltage circuit that controls, when the gate driver circuit current-drives the common line pass transistor of the N type, the predetermined voltage to a value lower than voltage of the second common line and controls, when the gate drive circuit voltage-drives the common line pass transistor of the N-Type, the predetermined voltage to a value higher than the voltage of the second common line.

2. A variable resistance memory device comprising:
a first common line;
a second common line;
plural memory cells each formed by serially connecting a memory element, resistance of which changes according to applied voltage, and an access transistor between the second common line and the first common line; and
a driving circuit that drives the plural memory cells through the first common line and the second common line, wherein
the driving circuit has:
a common line pass transistor of a P type connected between the first common line and a supply node for predetermined voltage;
a gate driver circuit for the common line pass transistor that current-drives the first common line when the memory element of the memory cell is changed from one side of a low resistance state and a high resistance state into the other side, and voltage-drives the first common line when a state of the memory element is reversely changed from the other side into the one side of the resistance states; and
a driving voltage circuit that controls, when the gate driver circuit current-drives the common line pass transistor of the P type, the predetermined voltage to a value higher than voltage of the second common line and controls, when the gate driver circuit voltage-drives the common line pass transistor of the p type, the predetermined voltage to a value lower than the voltage of the second common line.

3. A variable resistance memory device according to claim 1, wherein
plural access lines for controlling control voltage of the access transistor are provided, and a binary-voltage driven access control circuit that controls on and off of the access transistor in an access target memory cell is connected to the plural access lines.

4. A variable resistance memory device according to claim 2, wherein
plural access lines for controlling control voltage of the access transistor are provided, and a binary-voltage driven access control circuit that controls on and off of the access transistor in an access target memory cell is connected to the plural access lines.

5. A variable resistance memory device according to claim 3, wherein
a memory cell array is formed by arranging, by plural columns, column configuring sections of the memory cell array in which the plural memory cells and the common line pass transistor are connected for each of the first common lines, and
the second common line is connected in common to the plural column configuring sections.

6. A variable resistance memory device according to claim 4, wherein
a memory cell array is formed by arranging, by plural columns, column configuring sections of the memory cell array in which the plural memory cells and the common line pass transistor are connected for each of the first common lines, and
the second common line is connected in common to the plural column configuring sections.

7. A variable resistance memory device according to claim 5, wherein
the column configuring sections are arranged in pairs in a direction same as a direction of arrangement of the memory cells, and
the one common line pass transistor is connected in common to a pair of the column configuring sections.

8. A variable resistance memory device according to claim 6, wherein
the column configuring sections are arranged in pairs in a direction same as a direction of arrangement of the memory cells, and
the one common line pass transistor is connected in common to a pair of the column configuring sections.

9. A variable resistance memory device according to claim 1, wherein
the common line pass transistor also functions as a column switch that connects the first common line and a driver for write, erase, and readout of data.

10. A variable resistance memory device according to claim 2, wherein
the common line pass transistor also functions as a column switch that connects the first common line and a driver for write, erase, and readout of data.

11. A variable resistance memory device according to claim 1, wherein
the driving circuit controls, according to a result of verify readout performed in every application of a pulse that continues for time in which the common line pass transistor is on, a number of times of application of the pulse when the memory element is transitioned from one of the high resistance state and the low resistance state to the other and when the memory element is transitioned from the other to one of the resistance states with respect to each of the plural memory cells.

12. A variable resistance memory device according to claim 2, wherein the driving circuit controls, according to a result of verify readout performed in every application of a pulse that continues for time in which the common line pass transistor is on, a number of times of application of the pulse when the memory element is transitioned from one of the high resistance state and the low resistance state to the other and when the memory element is transitioned from the other to one of the resistance states with respect to each of the plural memory cells.

13. A variable resistance memory device according to claim 1, wherein the memory cell includes a supply layer for conductive ions between two electrodes and a resistance change layer that is set in contact with the supply layer for the conductive ions and to which the conductive ions are injected from the supply layer for the conductive ions or from which the injected conductive ions are returned to the supply layer according to applied voltage between the two electrodes.

14. A variable resistance memory device according to claim 2, wherein the memory cell includes a supply layer for conductive ions between two electrodes and a resistance change layer that is set in contact with the supply layer for the conductive ions and to which the conductive ions are injected from the supply layer for the conductive ions or from which the injected conductive ions are returned to the supply layer according to applied voltage between the two electrodes.

* * * * *